(12) United States Patent
Chen et al.

(10) Patent No.: US 9,203,529 B2
(45) Date of Patent: Dec. 1, 2015

(54) VIA PLACEMENT IN RADIO FREQUENCY SHIELDING APPLICATIONS

(71) Applicant: Skyworks Solutions, Inc., Woburn, MA (US)

(72) Inventors: Howard E. Chen, Anaheim, CA (US); Matthew Sean Read, Rancho Santa Margarita, CA (US); Hoang Mong Nguyen, Fountain Valley, CA (US); Anthony James LoBianco, Irvine, CA (US); Guohao Zhang, Nanjing (CN); Dinhphuoc Vu Hoang, Anaheim, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/577,910

(22) Filed: Dec. 19, 2014

(65) Prior Publication Data

US 2015/0126139 A1    May 7, 2015

Related U.S. Application Data

(62) Division of application No. 13/485,572, filed on May 31, 2012, now Pat. No. 8,948,712.

(51) Int. Cl.
*H04B 1/04* (2006.01)
*H04B 1/10* (2006.01)
(Continued)

(52) U.S. Cl.
CPC .............. *H04B 15/02* (2013.01); *H01L 21/561* (2013.01); *H01L 23/552* (2013.01); *H01L 24/97* (2013.01); *H01Q 1/526* (2013.01); *H04B 1/16* (2013.01); *H04B 1/44* (2013.01); *H05K 1/023* (2013.01); *H05K 1/115* (2013.01); *G06F 17/5081* (2013.01); *H01L 2224/32225* (2013.01); *H01L 2224/48091* (2013.01); *H01L 2224/48227* (2013.01); *H01L 2224/73265* (2013.01); *H01L 2224/92247* (2013.01); *H01L 2224/97* (2013.01); *H01L 2924/1531* (2013.01); *H01L 2924/19105* (2013.01); *H01L 2924/19107* (2013.01); *H01L 2924/3025* (2013.01);
(Continued)

(58) Field of Classification Search
USPC .............. 455/114.2, 296, 300, 301, 311; 361/816, 818; 257/659, 686
See application file for complete search history.

(56) References Cited

U.S. PATENT DOCUMENTS 3,816,911 A    6/1974    Knappenberger
4,151,637 A    5/1979    Zemek et al.
(Continued)

FOREIGN PATENT DOCUMENTS

JP    04-058596    2/1992
JP    08222885     8/1996
(Continued)

*Primary Examiner* — Nguyen Vo
(74) *Attorney, Agent, or Firm* — Knobbe, Martens, Olson & Bear, LLP

(57) ABSTRACT

Aspects of the present disclosure relate to determining the location and/or density of vias that form part of an RF isolation structure of a packaged module and the resulting RF isolation structures. From electromagnetic interference (EMI) data, locations of where via density can be increased and/or decreased without significantly degrading the EMI performance of the RF isolation structure can be identified. In certain embodiments, one or more vias can be added and/or removed from a selected area of the packaged module based on the EMI data.

19 Claims, 19 Drawing Sheets

(51) Int. Cl.

| | | |
|---|---|---|
| *H05K 9/00* | (2006.01) | |
| *H04B 15/02* | (2006.01) | |
| *H01L 23/552* | (2006.01) | |
| *H04B 1/16* | (2006.01) | |
| *H01L 21/56* | (2006.01) | |
| *H01L 23/00* | (2006.01) | |
| *H01Q 1/52* | (2006.01) | |
| *H04B 1/44* | (2006.01) | |
| *H05K 1/02* | (2006.01) | |
| *H05K 1/11* | (2006.01) | |
| *G06F 17/50* | (2006.01) | |
| *H04B 15/04* | (2006.01) | |

(52) U.S. Cl.
CPC ...... *H01L 2924/30107* (2013.01); *H04B 15/04* (2013.01); *H05K 2201/09618* (2013.01)

(56) References Cited

U.S. PATENT DOCUMENTS

| | | | |
|---|---|---|---|
| 4,241,497 | A | 12/1980 | Du Bois |
| 4,245,385 | A | 1/1981 | Zemek et al. |
| 4,447,945 | A | 5/1984 | Priscsak |
| 4,724,613 | A | 2/1988 | Dale |
| 4,857,483 | A | 8/1989 | Steffen et al. |
| 5,151,770 | A | 9/1992 | Inoue |
| 5,166,772 | A | 11/1992 | Soldner et al. |
| 5,166,864 | A | 11/1992 | Chitwood |
| 5,355,016 | A | 10/1994 | Swirbel |
| 5,428,508 | A | 6/1995 | Pronto |
| 5,940,964 | A | 8/1999 | Mugiya |
| 6,137,693 | A | 10/2000 | Schwiebert et al. |
| 6,192,577 | B1 | 2/2001 | Larsson |
| 6,202,294 | B1 | 3/2001 | Bogannam |
| 6,350,951 | B1 | 2/2002 | Askew |
| 6,426,881 | B1 | 7/2002 | Kurz |
| 6,449,828 | B2 | 9/2002 | Pahl et al. |
| 6,462,436 | B1 | 10/2002 | Kay et al. |
| 6,472,724 | B1 | 10/2002 | Matsuzawa et al. |
| 6,486,549 | B1 | 11/2002 | Chiang |
| 6,566,596 | B1 | 5/2003 | Askew |
| 6,601,293 | B1 | 8/2003 | Glenn |
| 6,650,009 | B2 | 11/2003 | Her |
| 6,855,893 | B2 | 2/2005 | Kumakura et al. |
| 6,865,084 | B2 | 3/2005 | Lin et al. |
| 6,947,295 | B2 | 9/2005 | Hsieh |
| 6,974,724 | B2 | 12/2005 | Hyvonen et al. |
| 6,994,901 | B1 | 2/2006 | Chen et al. |
| 7,030,469 | B2 | 4/2006 | Mahadevan et al. |
| 7,088,009 | B2 | 8/2006 | Hagen |
| 7,151,011 | B2 | 12/2006 | Sridharan et al. |
| 7,198,987 | B1 | 4/2007 | Warren et al. |
| 7,958,629 | B2 | 6/2011 | Thompson et al. |
| 8,071,431 | B2 | 12/2011 | Hoang et al. |
| 8,129,824 | B1 | 3/2012 | St. Amand et al. |
| 8,399,972 | B2 | 3/2013 | Hoang et al. |
| 8,948,712 | B2 | 2/2015 | Chen et al. |
| 2001/0013165 | A1 | 8/2001 | Hansen et al. |
| 2002/0083570 | A1 | 7/2002 | Inoue et al. |
| 2002/0155738 | A1 | 10/2002 | Ohsawa et al. |
| 2003/0002271 | A1 | 1/2003 | Nurminen |
| 2004/0012099 | A1 | 1/2004 | Nakayama |
| 2004/0125568 | A1 | 7/2004 | Tao |
| 2004/0180474 | A1 | 9/2004 | Oman |
| 2004/0231872 | A1 | 11/2004 | Arnold et al. |
| 2004/0238934 | A1 | 12/2004 | Warner |
| 2005/0167047 | A1 | 8/2005 | Huff et al. |
| 2006/0145361 | A1 | 7/2006 | Yang |
| 2006/0272857 | A1 | 12/2006 | Arnold |
| 2007/0071886 | A1 | 3/2007 | Babb et al. |
| 2007/0138639 | A1 | 6/2007 | Shin |
| 2008/0014678 | A1 | 1/2008 | Howard et al. |
| 2010/0078779 | A1 | 4/2010 | Barth et al. |
| 2011/0089529 | A1 | 4/2011 | Fowlkes et al. |
| 2012/0119346 | A1 | 5/2012 | Im et al. |
| 2012/0146178 | A1 | 6/2012 | Hoang et al. |
| 2014/0016277 | A1 | 1/2014 | Chen et al. |

FOREIGN PATENT DOCUMENTS

| | | |
|---|---|---|
| KR | 10-2012-0053332 | 5/2012 |
| WO | WO 99/62119 | 12/1999 |
| WO | WO 00/13233 | 3/2000 |
| WO | WO 02/17394 | 2/2002 |
| WO | WO 2005/050699 | 6/2005 |
| WO | WO 2005/093833 | 10/2005 |
| WO | WO 2008/018959 | 2/2008 |
| WO | WO 2008/103232 | 8/2008 |
| WO | WO 2010/014103 | 2/2010 |

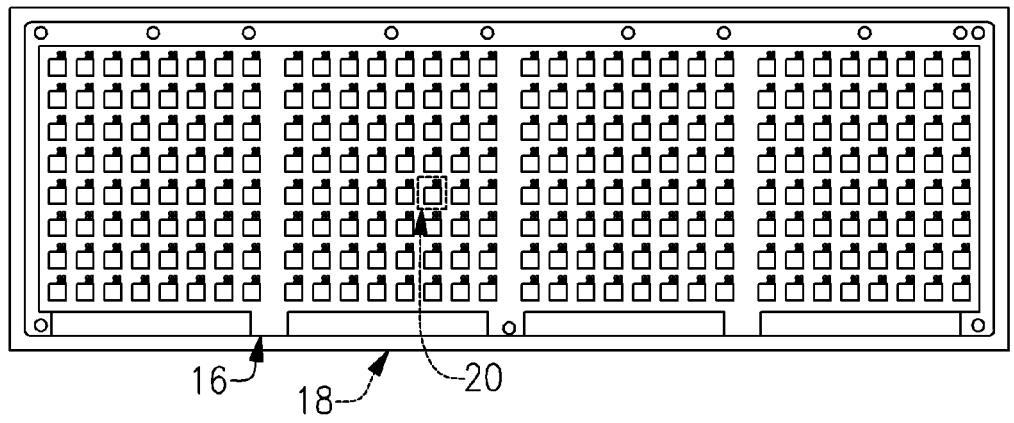
FIG.3A1
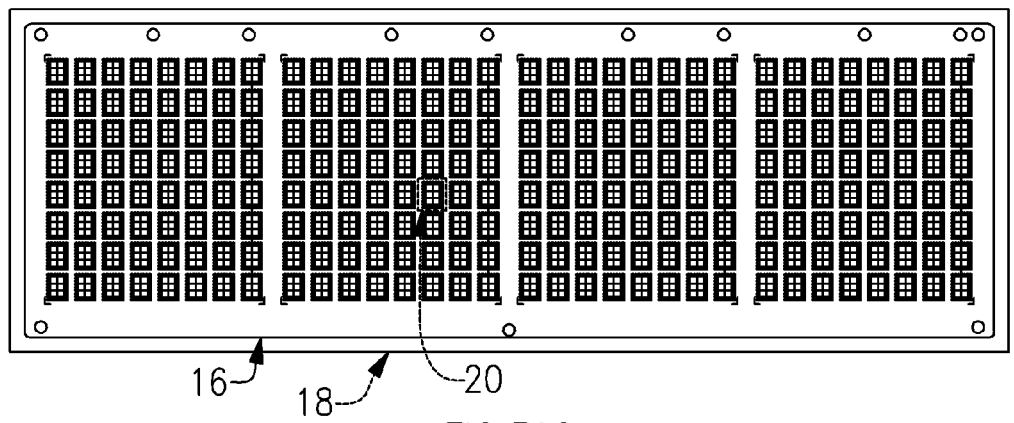
FIG.3A2

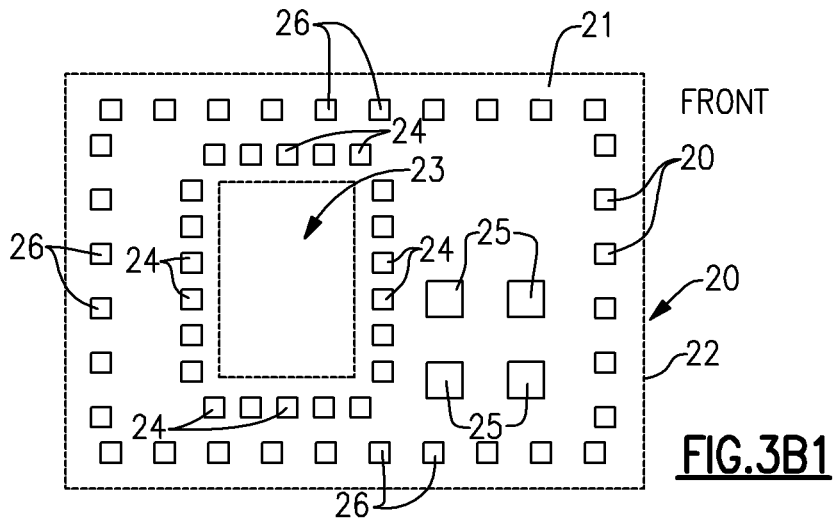
FIG.3B1
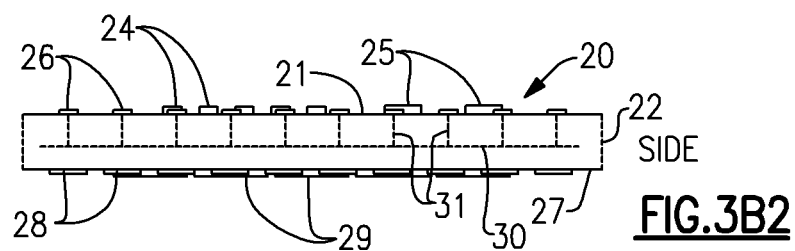
FIG.3B2
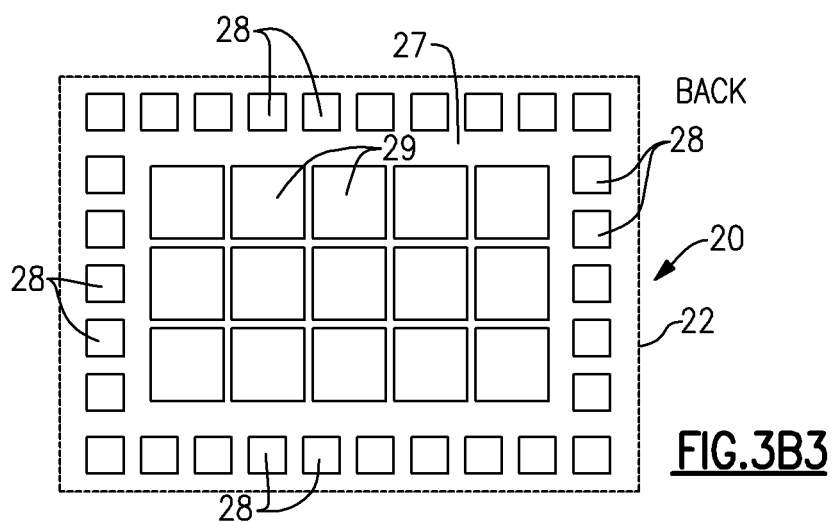
FIG.3B3

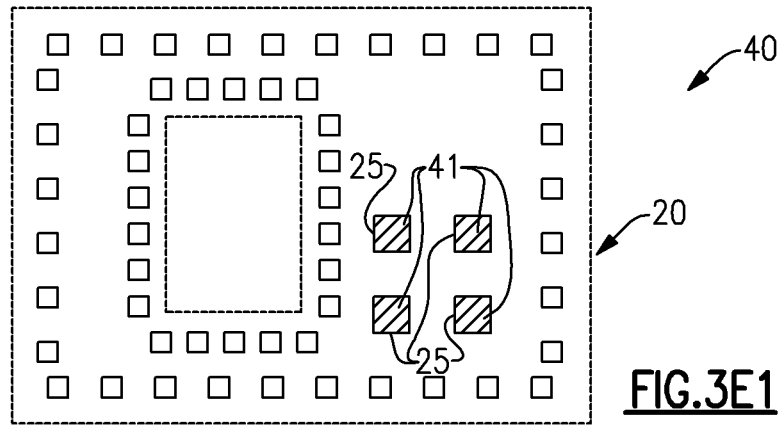
FIG.3E1
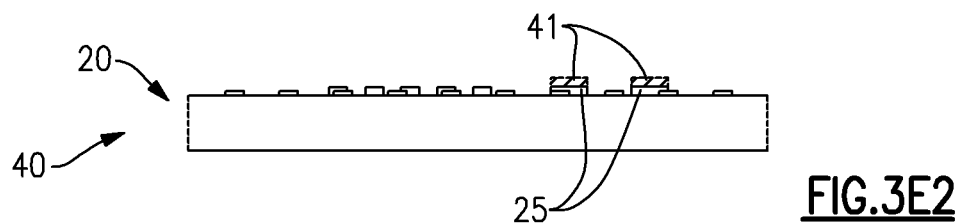
FIG.3E2
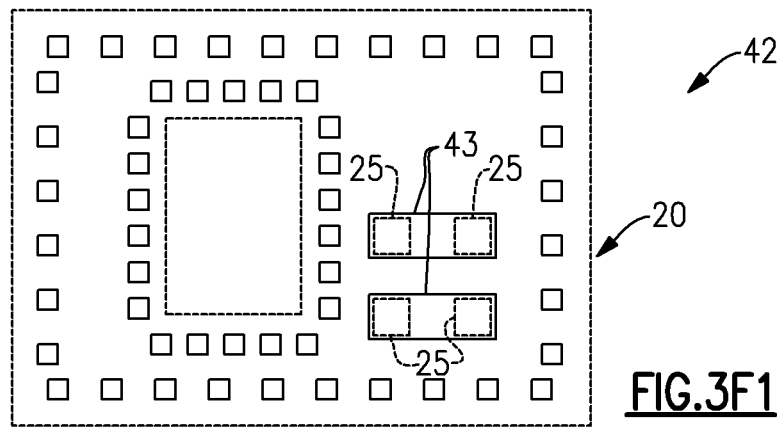
FIG.3F1
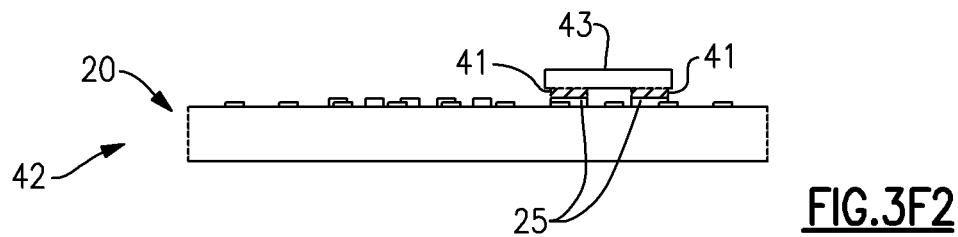
FIG.3F2

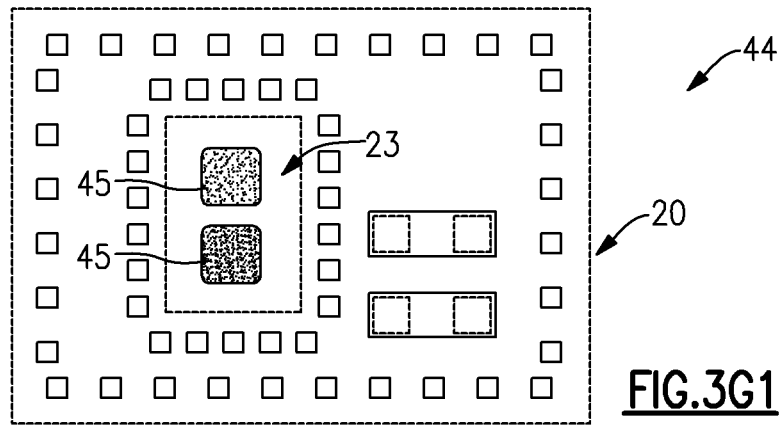
FIG.3G1
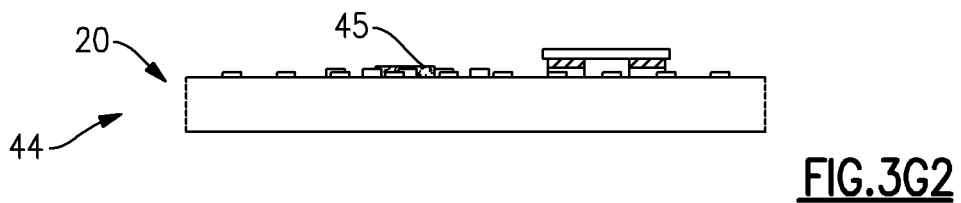
FIG.3G2
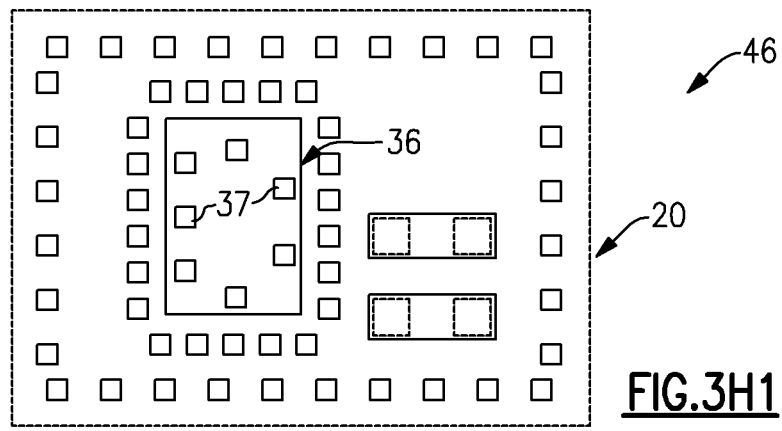
FIG.3H1
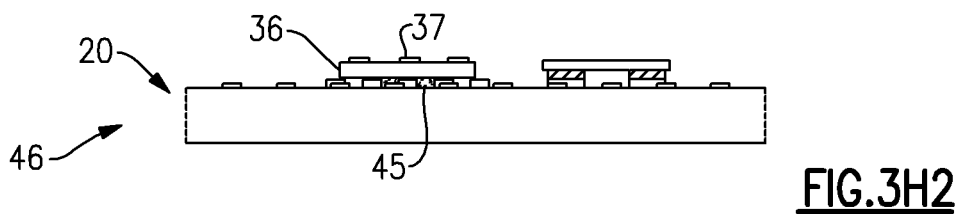
FIG.3H2

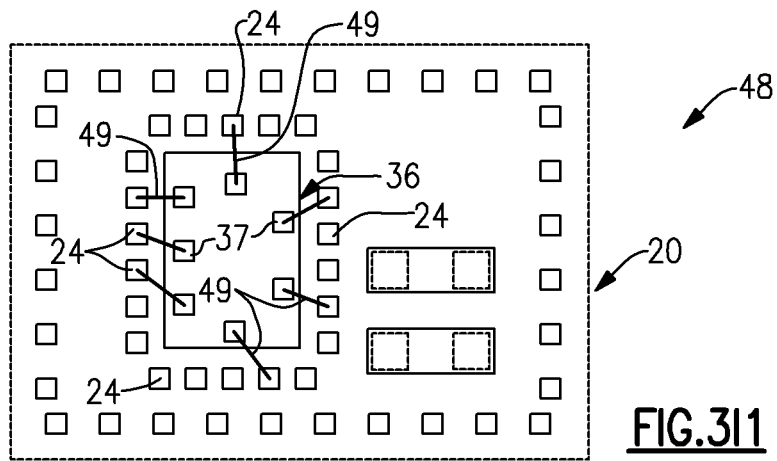
FIG. 3I1
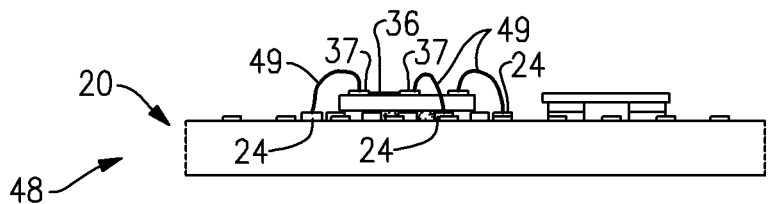
FIG. 3I2
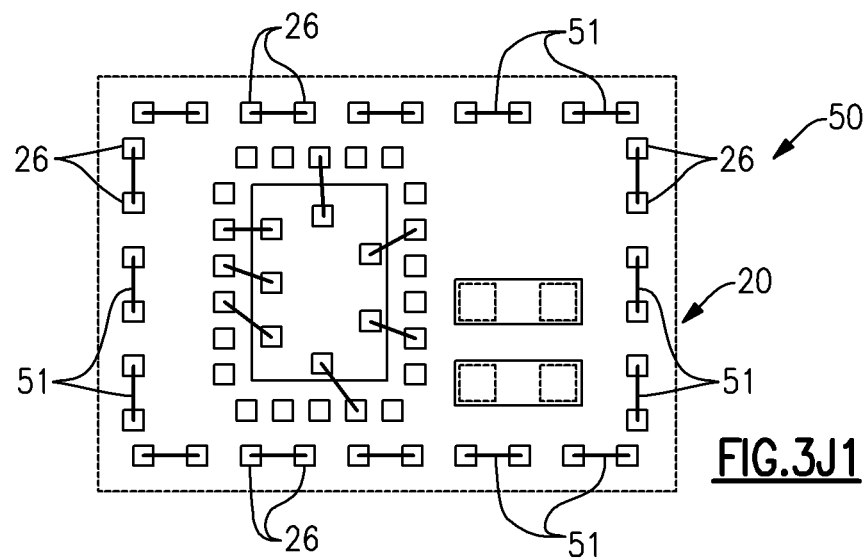
FIG. 3J1
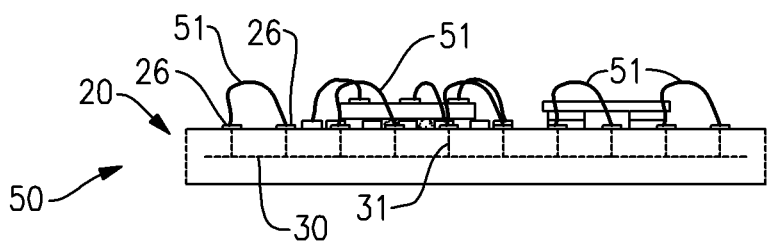
FIG. 3J2

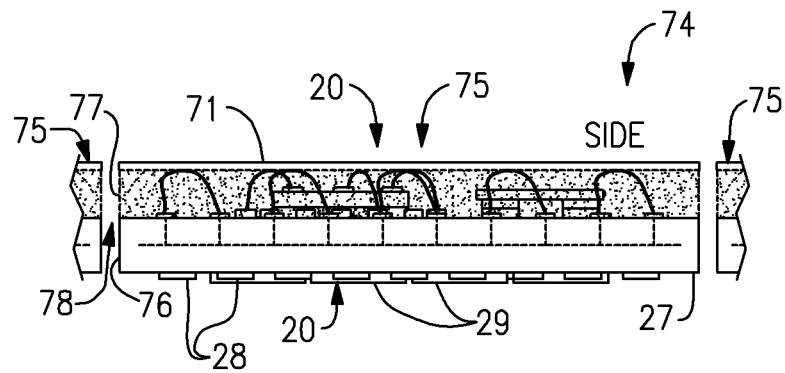
FIG.3R
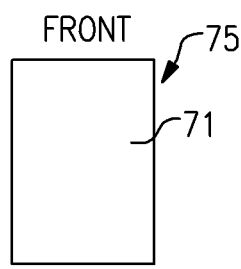
FIG.3S1
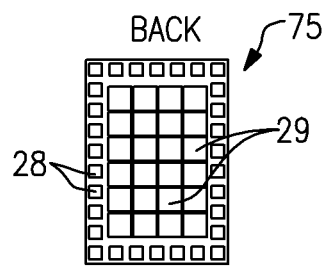
FIG.3S2
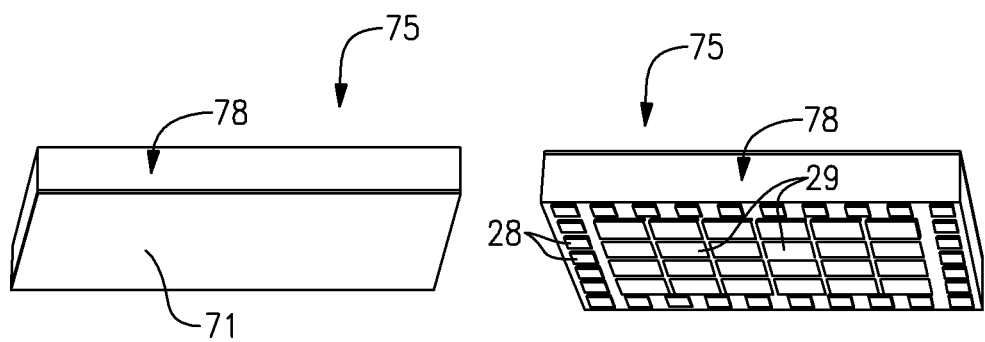
FIG.3S3

EMI SCAN

EMI SCAN FOR UPDATED VIA PLACEMENT
WITH ADDITIONAL VIAS AT HB OUTPUT

LEGEND
EMI (dBm)

VIA PLACEMENT IN RADIO FREQUENCY SHIELDING APPLICATIONS

CROSS-REFERENCE TO RELATED APPLICATION

This application is a divisional of U.S. patent application Ser. No. 13/485,572, filed May 31, 2012, titled "VIA DENSITY AND PLACEMENT IN RADIO FREQUENCY SHIELDING APPLICATIONS," which is hereby incorporated by reference herein in its entirety.

BACKGROUND

1. Technical Field

The present disclosure relates to packaged semiconductor structures and, more particularly, to structures that provide radio frequency (RF) isolation and/or electromagnetic (EMI) radiation.

2. Description of the Related Technology

Packaged semiconductor components can include integrated shielding technology within a package. To form a shield, which can be referred to as a "Faraday cage," a top layer conductive layer can be electrically connected to a bottom conductive layer by vias. For instance, the bottom conductive layer can be a ground plane and the vias can connect the top conductive layer to ground. The vias can provide an electrical connection between the top and the bottom conductive layers and also function as part of the shield itself. However, the vias can consume a significant amount of area in the package. At the same time, the vias can affect a strength of the ground connection of the shield.

SUMMARY OF CERTAIN INVENTIVE ASPECTS

The innovations described in the claims each have several aspects, no single one of which is solely responsible for its desirable attributes. Without limiting the scope of this invention, some prominent features will now be briefly discussed.

One aspect of this disclosure is a method of determining a via placement. The method includes obtaining electromagnetic interference data for an initial placement of vias around a radio frequency (RF) component. The RF component is positioned between a first conductive layer and a second conductive layer. The vias are included in a connection between the first conductive layer and the second conductive layer. The vias and the first and second conductive layers form at least a portion of an RF isolation structure around the RF component. The method also includes determining an updated placement of vias based at least in part on the electromagnetic interference data for the initial placement.

In some embodiments, determining the updated placement of vias can include identifying, based on the electromagnetic interference data for the initial placement, a selected defined area around the perimeter of the RF component associated with higher electromagnetic interference than other defined areas around the perimeter of the RF component in the initial placement; and increasing density of the vias in the updated placement in the selected defined area compared to the density of the vias in the selected defined area in the initial placement. Alternatively or additionally, the method can include identifying, based on the electromagnetic interference data for the initial placement, a defined area around the perimeter of the RF component associated with a permissible level of electromagnetic interference in the initial placement; and decreasing density of the vias in the updated placement in the defined area compared to the density of the vias in the initial placement.

According to certain embodiments, the electromagnetic interference data for the initial placement of vias corresponds to an unshielded RF component.

The method can be iterated any suitable number of times. For instance, the method can include obtaining electromagnetic interference data for the updated placement of vias around the RF component; and determining another updated placement of vias based at least in part on the electromagnetic interference data for the updated placement.

In accordance with some embodiments, electromagnetic interference data can be obtained for at least two different modes of operation of the RF component in the initial placement of vias.

Another aspect of this disclosure is a packaged module. The packaged module includes a substrate configured to receive at least one component. The packaged module also includes a radio frequency (RF) component coupled to a major surface of the substrate. The packaged module includes a first conductive layer disposed below the RF component, in which the first conductive layer configured at a ground potential. The packaged module includes a plurality of vias in the substrate that are disposed around the RF component. The plurality of vias have a higher density in a first region of the packaged module than a second region of the packaged module, in which the first region is associated with a higher electromagnetic interference than the second region. The packaged module includes a second conductive layer disposed above the RF component. The second conductive layer is electrically coupled to the plurality of vias such that the first conductive layer, the plurality of vias, and the second conductive layer form at least a portion of an RF isolation structure around the RF component.

In certain embodiments, the first region is disposed along a periphery of the packaged module and the second region is disposed along the periphery of the packaged module. According to some of these embodiments, the first region and the second region have approximately the same width in a dimension substantially parallel to an outer edge of the packaged module. The plurality of vias can be aligned along the periphery of the packaged module. The first region can have the highest via density of any region along the periphery of the packaged module that has an area at least as great as the first region, according to certain embodiments. The first region can have approximately the same area as the second region in some embodiments.

According to a number of embodiments, the RF component can be configured to emit more radiation to the first region than to the second region. Alternatively or additionally, the packaged module is configured such that the first region is exposed to more radiation than to the second region. In certain embodiments, the first region can correspond to a hot spot of the packaged module and the second region can correspond to a low radiating area of the packaged module. Alternatively or additionally, the first region can be more sensitive to external electromagnetic interference than the second region.

In certain embodiments, the packaged module can also include conductive features forming at least a portion of an electrical connection between the plurality of vias and the second conductive layer, the RF isolation structure including the conductive features. For example, the conductive features can include wirebonds or a metal can.

According to some embodiments, the RF component can include a power amplifier.

Another aspect of this disclosure is a packaged module that includes a substrate, an RF device, first and second conductive layers, and a plurality of vias. The substrate is configured to receive at least one component. The RF device is coupled to a major surface of the substrate. The first conductive layer is disposed below the RF component and configured at a ground potential. The plurality of vias are disposed around the RF component. The plurality of vias have a higher density in a first region around the RF component than a second region around the RF component having approximately the same area as the first region. The first region is more sensitive to external radiation than the second region. The second conductive layer is disposed above the RF component. The second conductive layer electrically coupled to plurality of vias such that the first conductive layer, the plurality of vias, and the second conductive layer form at least a portion of an RF isolation structure around the RF component.

Yet another aspect of this disclosure is a wireless device that includes an antenna, a packaged module and another module. The antenna is configured to facilitate transmitting and/or receiving a radio-frequency (RF) signal. The packaged module is in communication with the antenna. The packaged module includes a substrate having a ground plane and a plurality of vias in the substrate disposed along a periphery of the packaged module. Vias of the plurality of vias are spaced closer together along the periphery of the packaged module in a hot spot than in a low radiating area. The packaged module includes an RF circuit coupled to a major surface of the substrate. The packaged module also includes a second conductive layer disposed over the RF circuit. The second conductive layer is electrically coupled to plurality of vias such that the ground plane, the plurality of vias, and the second conductive layer form at least a portion of an RF isolation structure around the RF circuit. The other module is in communication with the packaged module.

In some embodiments, the hot spot can be associated with electromagnetic interference generated by the packaged module and the plurality of vias can be configured to isolate the other module from the electromagnetic interference associated with the hot spot. According to certain embodiments, the hot spot can be associated with electromagnetic interference generated by the other module and the plurality of vias can be configured to shield the packaged module from electromagnetic interference associated with the hot spot.

In accordance with a number of embodiments, the packaged module further includes conductive features forming at least a portion of an electrical connection between the plurality of vias and the second conductive layer, in which the RF isolation structure includes the conductive features. The conductive features can include wirebonds, for example.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIGS. 3A1 and 3A2 show front and back sides of an example laminate panel configured to receive a plurality of dies for formation of packaged modules.

FIGS. 3B1 to 3B3 show various views of a laminate substrate of the panel configured to yield an individual module.

FIGS. 3E1 and 3E2 show various views of the laminate substrate being prepared for mounting of example surface-mount technology (SMT) devices.

FIGS. 3F1 and 3F2 show various views of the example SMT devices mounted on the laminate substrate.

FIGS. 3G1 and 3G2 show various views of the laminate substrate being prepared for mounting of an example die.

FIGS. 3H1 and 3H2 show various views of the example die mounted on the laminate substrate.

FIGS. 3I1 and 3I2 show various views of the die electrically connected to the laminate substrate by example wirebonds.

FIGS. 3J1 and 3J2 show various views of wirebonds formed on the laminate substrate and configured to facilitate electromagnetic (EM) isolation between an area defined by the wirebonds and areas outside of the wirebonds.

FIG. 3R shows individual packaged modules being cut from the panel.

FIGS. 3S1 to 3S3 show various views of an individual packaged module.

Figure 1A:
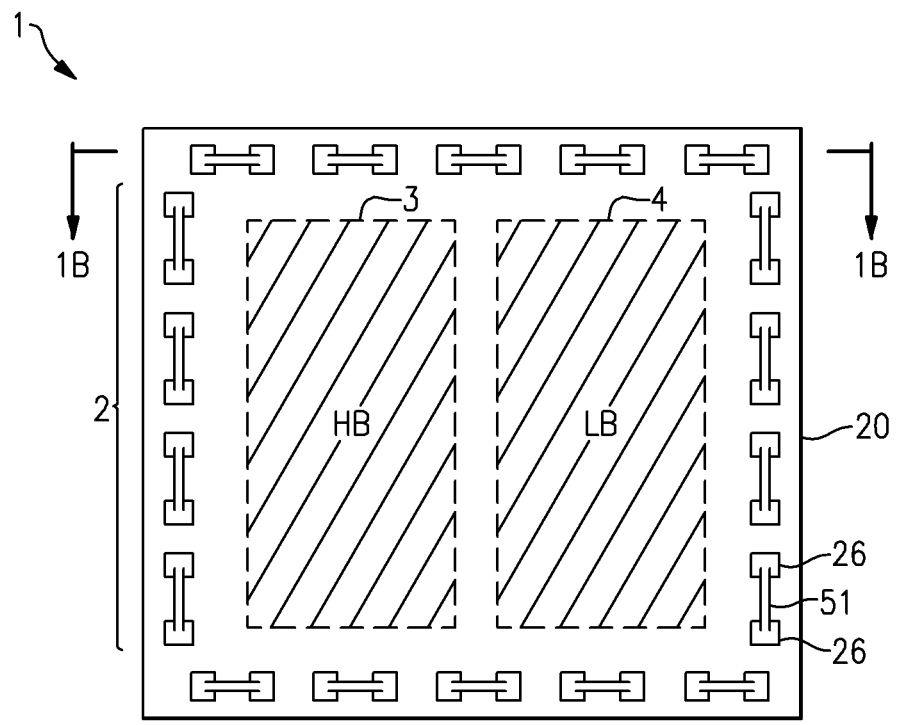
FIG. 1A is top plan view of an illustrative packaged module.

Features of the apparatus, systems, and methods will be described with reference to the drawings summarized above. Throughout the drawings, reference numbers are re-used to indicate correspondence between referenced elements. It will be understood that all drawings are not necessarily to scale. The drawings, associated descriptions, and specific implementations are provided for illustrative purposes and are not intended to limit the scope of the disclosure.

DETAILED DESCRIPTION OF SOME EMBODIMENTS

Vias can form part of an electrical connection between the top conductive layer and the bottom conductive layer of an RF isolation structure. It can be desirable to have a strong ground connection to the RF isolation structure, for example from one of the conductive layers. The strength of the RF isolation structure can be based on a strength of the ground connection. More vias can provide a stronger ground connection. In previous designs, as many vias as possible were included in order to provide a strong ground connection to certain RF isolation structures. However, those vias consumed significant die area and increased costs of the packaged module.

In this disclosure, it is recognized that via placements can be determined based on electromagnetic interference (EMI) data, such as EMI probing data and/or near field scan data. Particular features related to isolation associated with RF signals are also recognized in this disclosure. One or more features described herein relate to selectively placing vias such that an RF isolation structure provides desired RF isolation without consuming excess die area. For instance, EMI data from a particular environment can be obtained and via placement can be determined based on such data.

Generally described, aspects of this disclosure relate to determining the location and/or density of vias that form part of an RF isolation structure. From simulation and/or EMI data, locations of "hot spots" and/or "non-radiating areas" of a packaged module can be determined. A "hot spot" can be an area of the packaged module that emits a relatively high amount of electromagnetic radiation and/or an area of the packaged module that receives a relatively high amount of external electromagnetic radiation. A "non-radiating area" can be an area of the packaged module that emits a relatively low amount of electromagnetic radiation and/or an area of the packaged module that receives a relatively low amount of external electromagnetic radiation. Based on the locations of the hot spots and/or non-radiating areas, a density of vias that form part of the RF isolation structure can be adjusted in a selected area of the packaged module without significantly degrading the EMI performance of the RF isolation structure. In certain embodiments, one or more vias can be added and/or removed from a selected area of the packaged module. For instance, vias can be removed around non-radiating areas. As another example, vias can be added around hot spots. Alternatively or additionally, the sensitivity of locations of the packaged module to external radiation can be determined. Based on the sensitivity data, the location and/or density of vias can be adjusted.

By adjusting the location and/or density of the vias, the RF isolation structure can consume less area on a substrate. As a result, the packaged module can be smaller, less expensive, consume less power, or any combination thereof. Tailoring via location and/or density to particular RF isolation needs can reduce the total number of vias without significantly degrading EMI performance. This can result in fewer vias being used, which can reduce the total cost of a substrate that includes the vias. In production, these cost savings can be significant when a large number of packaged modules are manufactured.

Described herein are various examples of systems, apparatus, devices structures, materials and/or methods related to fabrication of packaged modules having a radio-frequency (RF) circuit and wirebond-based electromagnetic (EM) isolation structures. Although described in the context of RF circuits, one or more features described herein can also be utilized in packaging applications involving non-RF components. Similarly, one or more features described herein can also be utilized in packaging applications without the EM isolation functionality. It will also be understood that one or more features described herein can be applied to isolation structures that do not include wirebonds.

FIG. 1A is top plan view of an illustrative packaged module 1. The packaged module 1 can include one or more circuit elements. In a number of embodiments, the one or more circuit elements include an RF circuit element. The packaged module 1 can include an RF isolation structure that includes a plurality of vias. The packaged module 1 can be a packaged integrated circuit. The illustrated packaged module 1 includes a radio frequency (RF) isolation structure 2 and an RF component that includes a high band portion 3 and a low band portion 4. Although not illustrated in FIG. 1A for clarity, the packaged module 1 can include numerous other structures.

The RF isolation structure 2 can function as a Faraday cage. The RF isolation structure 2 can include conductive features around at least one RF component. In certain implementations, the conductive features can include a plurality of wirebonds 51 that in combination with vias are configured to provide RF isolation. More details of the plurality of wirebonds 51 will be provided later, for example, with reference to FIGS. 3J1 and 3J2. In some other implementations, the conductive features can include other structures, such as a solid metal can.

The illustrated packaged module 1 is a packaged power amplifier integrated circuit (IC) in which the high band portion 3 includes a high band power amplifier circuit and the low band portion 4 includes a low band power amplifier circuit. Power amplifiers can be used to boost the amplitude of a relatively weak RF signal. Thereafter, the boosted RF signal can be used for a variety of purposes, including, for example, driving an antenna, a switch, a mixer, a filter, or the like, or any combination thereof in an RF system. In certain electronic systems, such as multi-band systems, different power amplifier structures can be used to amplify RF signals of different frequencies. In the illustrated configuration, the packaged module 1 includes the high band power amplifier circuit for amplifying relatively high frequency RF signals and the low band power amplifier circuit for amplifying relatively low frequency RF signals.

Although the packaged module 1 illustrates one example of a packaged IC that can be used herein, the methods and apparatus described herein can be implemented in connection with a variety of other isolation structures.

Figure 1B:
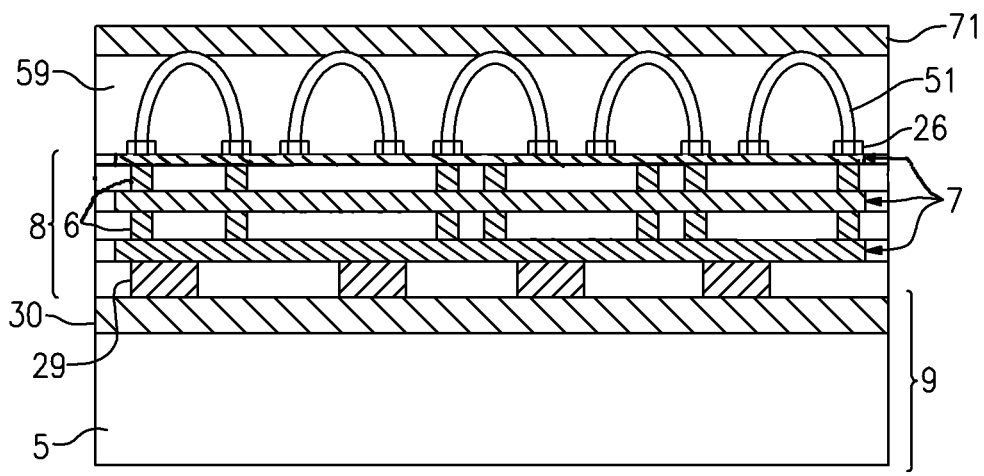
FIG. 1B shows a cross section of the packaged module of FIG. 1A along the line 1B-1B of FIG. 1A

FIG. 1B shows a cross section of the packaged module 1 along the line 1B-1B of FIG. 1A. The illustrated cross section shows a side view of the RF isolation structure 2. As illustrated, the packaged module 1 includes a system board 9, a printed circuit board 8, wirebonds 51, overmold structure 59, and a conductive layer 71 formed over the overmold structure 59. The system board can include a substrate system board substrate 5 and an electrical reference plane 30, which can be a ground plane. The printed circuit board can be a laminate substrate. The printed circuit board 8 can include input output (I/O) pads (for example, ground contact pads 29), a plurality of vias 6, and one or more racetracks 7. The plurality of vias 6 and the one or more racetracks 7 can electrically connect the ground contact pads 29 to wirebond pads 26, thereby electrically connecting the reference plane 30 to the wirebonds 51. The wirebonds 51 can be disposed above the printed circuit board 8 in the orientation shown in FIG. 1B. Overmold structure 59 can encapsulate the wirebonds 51. More detail about the overmold structure 59 will be provided later, for example, with reference to FIGS. 3L-3M. The wirebonds 51 can be electrically connected to the conductive layer 71.

As illustrated, the RF isolation structure 2 includes the ground plane 30, the ground contact pads 29, the racetrack 7, the plurality of vias 6, the wirebonds 51, and the conductive layer 71. For instance, the plurality of vias 6 can provide RF isolation from RF signals generated by RF circuits within the RF isolation structure 2 and/or outside of the RF isolation structure 2. The vias 6 can be spaced apart by distances such that most of the power of an RF signal is blocked by the vias 6. The placement the vias 6 can be determined in accordance with one or more features described herein.

Although the illustrative cross section of FIG. 1B shows two layers of vias 6, it will be understood that one or more features described herein can be applied to RF isolation structures that include any suitable number of layers of vias 6. For instance, in other implementations, there can be one layer of vias 6. As another example, in certain implementations there can be three or more layers of vias 6. In implementations with two or more layers of vias 6, the vias 6 can be disposed in the same placement or a different placement in different layers. While the plurality of vias 6 is illustrated as being the same size, it will be understood that two or more vias may have different sizes.

Figure 2:
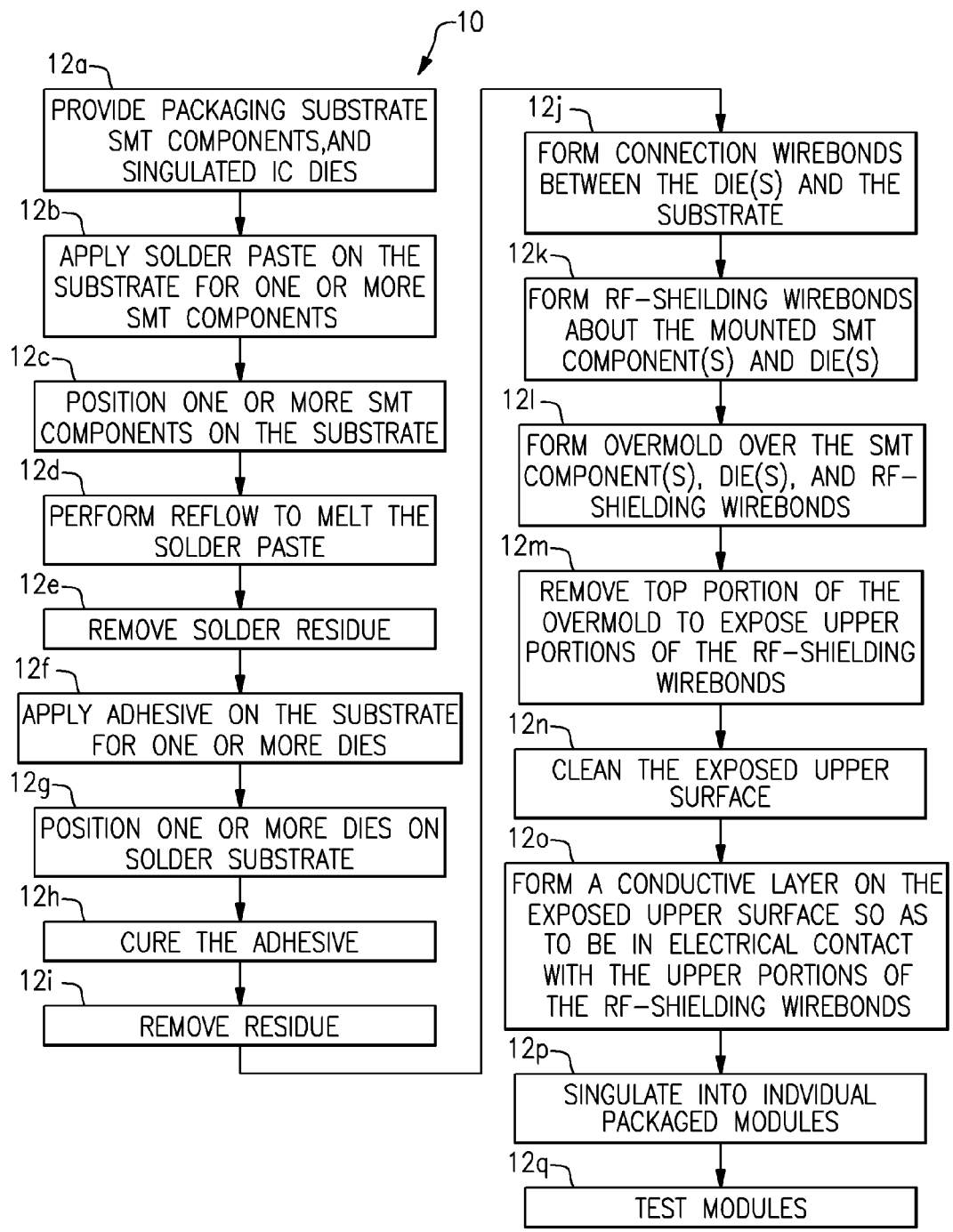
FIG. 2 shows a process that can be implemented to fabricate a packaged module that includes a die having an integrated circuit (IC).

FIG. 2 shows a process 10 that can be implemented to fabricate a packaged module 1, such as a packaged module, having and/or by way of one or more features as described herein. FIG. 2 shows various parts and/or stages of various operations associated with the process 10 of FIG. 2.

In block 12a of FIG. 2, a packaging substrate and parts to be mounted on the packaging substrate can be provided. Such parts can include, for example, one or more surface-mount technology (SMT) components and one or more singulated dies having integrated circuits (ICs). FIGS. 3A1 and 3A2 show that in some embodiments, the packaging substrate can include a laminate panel 16. FIG. 3A1 shows the front side of the example laminate panel 16; and FIG. 3A2 shows the back side of the example laminate panel 16. The laminate panel 16 can include a plurality of individual module substrates 20 arranged in groups that are sometimes referred to as arrays 18. Although four separate molded sections are shown in FIGS. 3A1, 3A2, 3M, and 3Q, any of the features described in the application can be applied to other suitable arrangements such as a single array mold cap without breaks.

FIGS. 3B1-3B3 show front, side and back views, respectively, of an example configuration of the individual module substrate 20. For illustrative purposes, a boundary 22 can define an area occupied by the module substrate 20 on the panel 16. Within the boundary 22, the module substrate 20 can include a front surface 21 and a back surface 27. Shown on the front surface 21 is an example mounting area 23 dimensioned to receive a die (not shown). A plurality of example contact pads 24 are arranged about the die-receiving area 23 so as to allow formation of connection wirebonds between the die and contact pads 28 arranged on the back surface 27. Although not shown, electrical connections between the wirebond contact pads 24 and the module's contact pads 28 can be configured in a number of ways. Also within the boundary 22 are two sets of example contact pads 25 configured to allow mounting of, for example passive SMT devices (not shown). The contact pads can be electrically connected to some of the module's contact pads and/or ground contact pads 29 disposed on the back surface 27. Also within the boundary 22 are a plurality of wirebond pads 26 configured to allow formation of a plurality of EM-isolating wirebonds (not shown). The wirebond pads 26 can be electrically connected to an electrical reference plane (such as a ground plane) 30. Such connections between the wirebond pads 26 and the ground plane 30 (depicted as dotted lines 31) can be achieved in a number of ways. For instance, as shown in FIG. 1B, a plurality of vias 6 and/or one or more racetracks 7 can form at least part of the electrical connection between the wirebond pads 26 and the ground plane 30. The vias 6 and/or racetrack(s) 7 can form a portion of an RF isolation structure 2 around an RF circuit in the module. In some embodiments, the ground plane 30 may or may not be connected to the ground contact pads 29 disposed on the back surface 27.

Figure 3C:
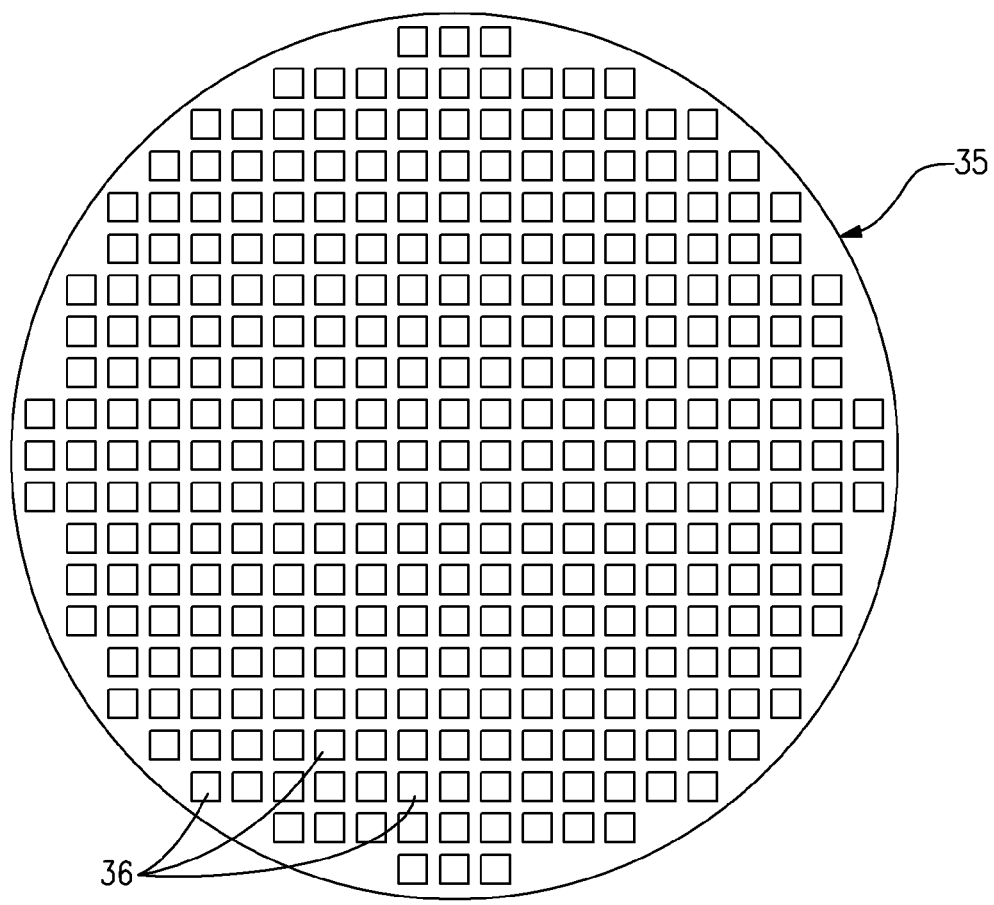
FIG. 3C shows an example of a fabricated semiconductor wafer having a plurality of dies that can be singulated for mounting on the laminate substrate.
Figure 3D:
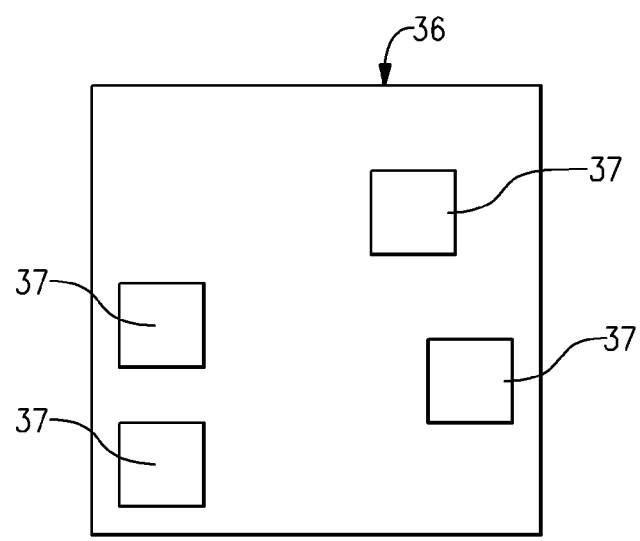
FIG. 3D depicts an individual die showing example electrical contact pads for facilitating connectivity when mounted on the laminate substrate.

FIG. 3C shows an example fabricated wafer 35 that includes a plurality of functional dies 36 awaiting to be cut (or sometimes referred to as singulated) into individual dies. Such cutting of the dies 36 can be achieved in a number of ways. FIG. 3D schematically depicts an individual die 36 where a plurality of metalized contact pads 37 can be provided. Such contact pads can be configured to allow formation of connection wirebonds between the die 36 and the contact pads 24 of the module substrate (e.g., FIG. 3B1).

In block 12b of FIG. 2, solder paste can be applied on the module substrate to allow mounting of one or more SMT devices. FIGS. 3E1 and 3E2 show an example configuration 40 where solder paste 41 is provided on each of the contact pads 25 on the front surface of the module substrate 20. In some implementations, the solder paste 41 can be applied to desired locations on the panel (e.g., 16 in FIG. 3A1) in desired amount by an SMT stencil printer.

In block 12c of FIG. 2, one or more SMT devices can be positioned on the solder contacts having solder paste. FIGS. 3F1 and 3F2 show an example configuration 42 where example SMT devices 43 are positioned on the solder paste 41 provided on each of the contact pads 25. In some implementations, the SMT devices 43 can be positioned on desired locations on the panel by an automated machine that is fed with SMT devices from tape reels.

In block 12d of FIG. 2, a reflow operation can be performed to melt the solder paste to solder the one or more SMT devices on their respective contact pads. In some implementations, the solder paste 41 can be selected and the reflow operation can be performed to melt the solder paste 41 at a first temperature to thereby allow formation of desired solder contacts between the contact pads 25 and the SMT devices 43.

In block 12e of FIG. 2, solder residue from the reflow operation of block 12d can be removed.

In block 12f of FIG. 2, adhesive can be applied on one or more selected areas on the module substrate 20 to allow mounting of one or more dies. FIGS. 3G1 and 3G2 show an example configuration 44 where adhesive 45 is applied in the die-mounting area 23. In some implementations, the adhesive 45 can be applied to desired locations on the panel (e.g., 16 in FIG. 3A1) in desired amount by techniques such as screen printing.

In block 12g of FIG. 2, one or more dies can be positioned on the selected areas with adhesive applied thereon. FIGS. 3H1 and 3H2 show an example configuration 46 where an example die 36 is positioned on the die-mounting area 23 via the adhesive 45. In some implementations, the die 36 can be positioned on the die-mounting area on the panel by an automated machine that is fed with dies from a tape reel.

In block 12h of FIG. 2, the adhesive between the die the die-mounting area can be cured. Preferably, such a curing operation can be performed at one or more temperatures that are lower than the above-described reflow operation for mounting of the one or more SMT devices on their respective contact pads. Such a configuration allows the solder connections of the SMT devices to remain intact during the curing operation.

In block 12i of FIG. 2, adhesive residue from the mounting operation of blocks 12f-12g can be removed.

In block 12j of FIG. 2, electrical connections such as wirebonds can be formed between the mounted die(s) and corresponding contact pads on the module substrate 20. FIGS. 3I1 and 3I2 show an example configuration 48 where a number of wirebonds 49 are formed between the contact pads 37 of the die 36 and the contact pads 24 of the module substrate 20. Such wirebonds can provide electrical connections for signals and/or power to and from one or more circuits of the die 36. In some implementations, the formation of the foregoing wirebonds can be achieved by an automated wirebonding machine.

In block 12k of FIG. 2, a plurality of RF-shielding wirebonds can be formed about a selected area on the module substrate 20. FIGS. 3J1 and 3J2 show an example configuration 50 where a plurality of RF-shielding wirebonds 51 are formed on wirebond pads 26. The wirebond pads 26 are schematically depicted as being electrically connected (dotted lines 31) with one or more reference planes such as a ground plane 30. In some embodiments, such a ground plane can be disposed within the module substrate 20. The foregoing electrical connections between the RF-shielding wirebonds 51 and the ground plane 30 can yield an interconnected RF-shielding structure at sides and underside of the area defined by the RF-shielding wirebonds 51. The electrical connections between the RF-shielding wirebonds 51 and the ground plane 30 can include vias 6 and/or one or more racetracks 7, for example, as described with reference to FIG. 1B. As described herein, a conductive layer can be formed above such an area and connected to upper portions of the RF-shielding wirebonds 51 to thereby form an RF isolation structure 2 having an RF-shielded volume.

In the example configuration 50 of FIGS. 3J1 and 3J2, the RF-shielding wirebonds 51 are shown to form a perimeter around the area where the die (36) and the SMT devices (43) are located. Other perimeter configurations are also possible. For example, a perimeter can be formed with RF-wirebonds around the die, around one or more of the SMT devices, or any combination thereof. In some implementations, an RF-wirebond-based perimeter can be formed around any circuit, device, component or area where RF-isolation is desired. For the purpose of description, it will be understood that RF-isolation can include keeping RF signals or noise from entering or leaving a given shielded area. Thus, for the purpose of description, it will be understood that the terms isolation and shielding can be used interchangeably as appropriate. For example, an RF component being shielded can include a situation where some or substantially all of an RF signal from another source is being blocked from reaching the RF component. As another example, an RF component being isolated can include a situation where some or substantially all of an RF signal (for example, noise or an actively generated signal) is being blocked from reaching from another device. Unless the context indicates otherwise, it will be understood that each of the terms shielding and isolation can include either or both of the foregoing functionalities.

In the example configuration 50 of FIGS. 3J1 and 3J2, the RF-shielding wirebonds 51 are shown to have an asymmetrical side profile configured to facilitate controlled deformation during a molding process as described herein. Additional details concerning such wirebonds can be found in, for example, PCT Publication No. WO 2010/014103 titled "SEMICONDUCTOR PACKAGE WITH INTEGRATED INTERFERENCE SHIELDING AND METHOD OF MANUFACTURE THEREOF." In some embodiments, other shaped RF-shielding wirebonds can also be utilized. For example, generally symmetric arch-shaped wirebonds as described in U.S. Pat. No. 8,071,431, titled "OVERMOLDED SEMICONDUCTOR PACKAGE WITH A WIREBOND CAGE FOR EMI SHIELDING," can be used as RF-shielding wirebonds in place of or in combination with the shown asymmetric wirebonds. In some embodiments, RF-shielding wirebonds do not necessarily need to form a loop shape and have both ends on the surface of the module substrate. For example, wire extensions with one end on the surface of the module substrate and the other end positioned above the surface (for connecting to an upper conductive layer) can also be utilized.

In the example configuration 50 of FIGS. 3J1 and 3J2, the RF-shielding wirebonds 51 are shown to have similar heights that are generally higher than heights of the die-connecting wirebonds (49). Such a configuration allows the die-connecting wirebonds (49) to be encapsulated by molding compound as described herein, and be isolated from an upper conductive layer to be formed after the molding process.

Figure 3K:
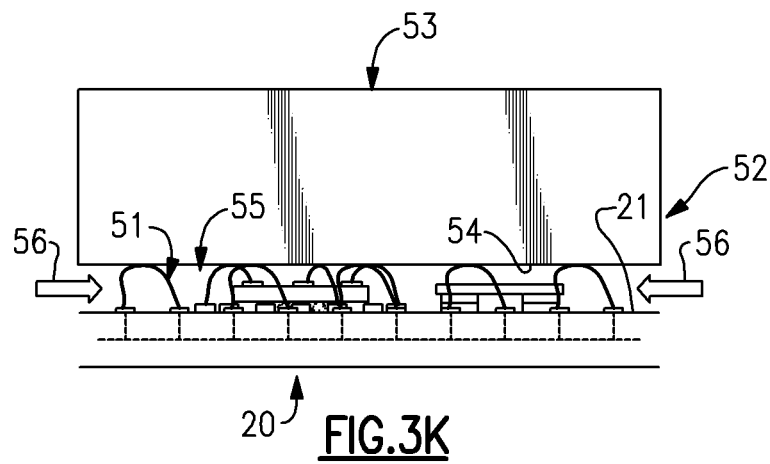
FIG. 3K shows a side view of molding configuration for introducing molding compound to a region above the laminate substrate.

In block 12l of FIG. 2, an overmold can be formed over the SMT component(s), die(s), and RF-shielding wirebonds. FIG. 3K shows an example configuration 52 that can facilitate formation of such an overmold. A mold cap 53 is shown to be positioned above the module substrate 20 so that the lower surface 54 of the mold cap 53 and the upper surface 21 of the module substrate 20 define a volume 55 where molding compound can be introduced.

In some implementations, the mold cap 53 can be positioned so that its lower surface 54 engages and pushes down on the upper portions of the RF-shielding wirebonds 51. Such a configuration allows whatever height variations in the RF-shielding wirebonds 51 to be removed so that the upper portions touching the lower surface 54 of the mold cap 53 are at substantially the same height. When the mold compound is introduced and an overmold structure is formed, the foregoing technique maintains the upper portions of the encapsulated RF-shielding wirebonds 51 at or close to the resulting upper surface of the overmold structure.

In the example molding configuration 52 of FIG. 3K, molding compound can be introduced from one or more sides of the molding volume 55 as indicated by arrows 56. In some implementations, such an introduction of molding compound can be performed under heated and vacuum condition to facilitate easier flow of the heated molding compound into the volume 55.

Figure 3L:
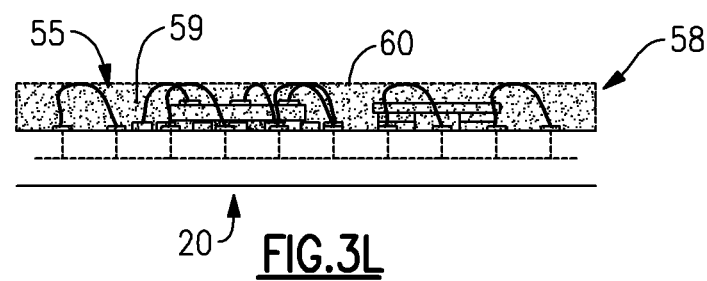
FIG. 3L shows a side view of an overmold formed via the molding configuration of FIG. 3K.

FIG. 3L shows an example configuration 58 where molding compound has been introduced into the volume 55 as described in reference to FIG. 3K and the molding cap removed to yield an overmold structure 59 that encapsulates the various parts (e.g., die, die-connecting wirebonds, and SMT devices). The RF-shielding wirebonds are also shown to be substantially encapsulated by the overmold structure 59. The upper portions of the RF-shielding wirebonds are shown to be at or close to the upper surface 60 of the overmold structure 59.

Figure 3M:
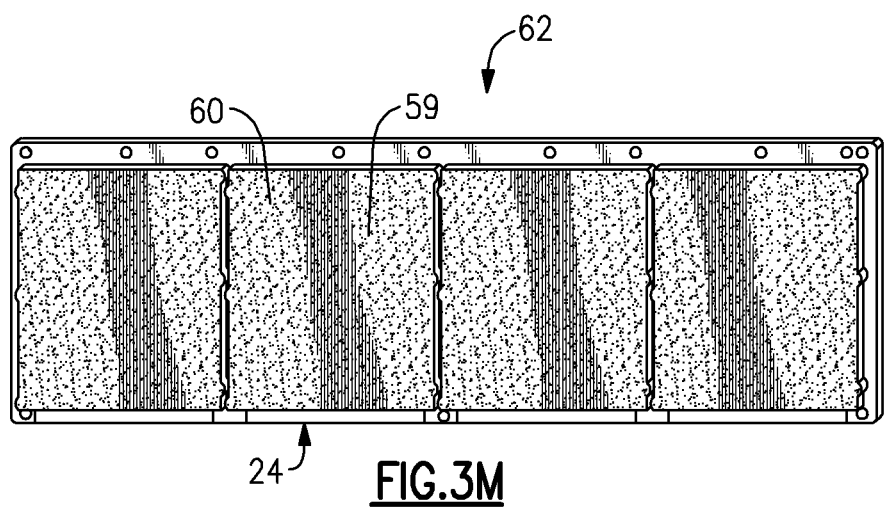
FIG. 3M shows the front side of a panel with the overmold.

FIG. 3M shows an example panel 62 that has overmold structures 59 formed over the multiple array sections. Each array section's overmold structure can be formed as described herein in reference to FIGS. 3K and 3L. The resulting overmold structure 59 is shown to define a common upper surface 60 that covers the multiple modules of a given array section.

The molding process described herein in reference to FIGS. 3K-3M can yield a configuration where upper portions of the encapsulated RF-shielding wirebonds are at or close to the upper surface of the overmold structure. Such a configuration may or may not result in the RF-shielding wirebonds forming a reliable electrical connection with an upper conductor layer to be formed thereon.

Figure 3N:
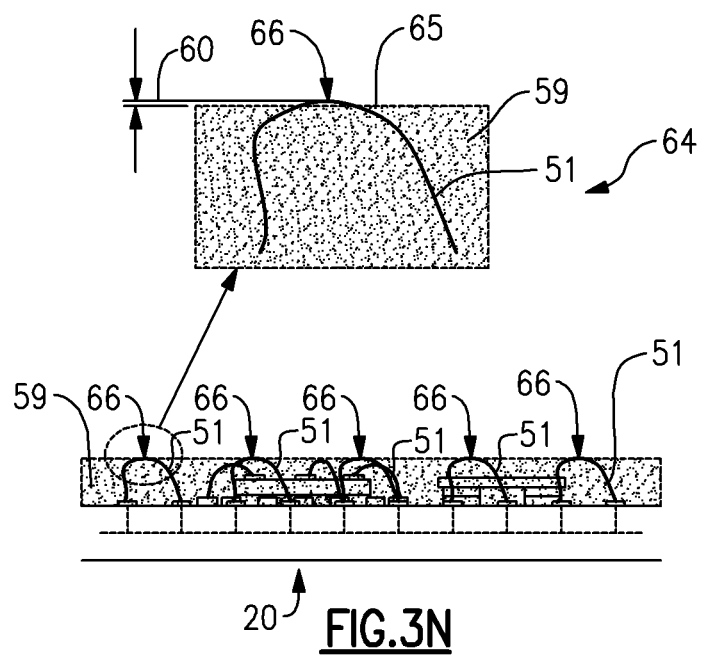
FIG. 3N shows a side view of how an upper portion of the overmold can be removed to expose upper portions of the EM isolation wirebonds.

In block 12m of FIG. 2, a top portion of the overmold structure can be removed to better expose upper portions of the RF-shielding wirebonds. FIG. 3N shows an example configuration 64 where such a removal has been performed. In the example, the upper portion of the overmold structure 59 is shown to be removed to yield a new upper surface 65 that is lower than the original upper surface 60 (from the molding process). Such a removal of material is shown to better expose the upper portions 66 of the RF-shielding wirebonds 51.

Figure 3O:
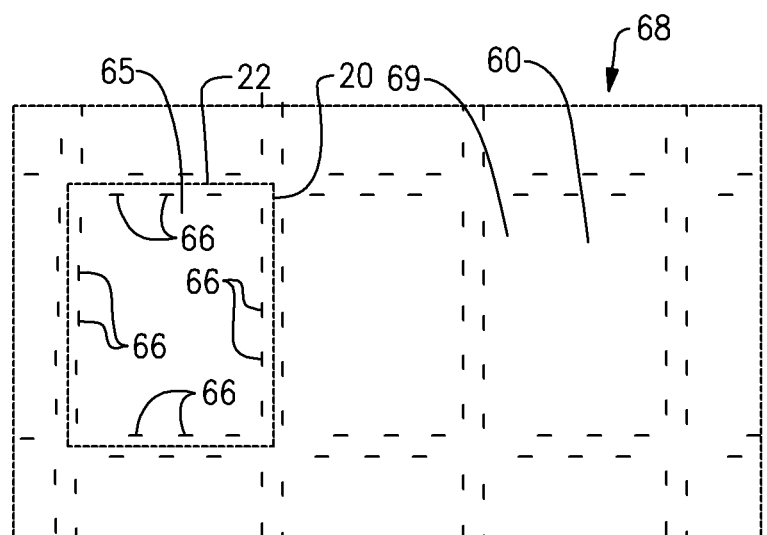
FIG. 3O shows a photograph of a portion of a panel where a portion of the overmold has its upper portion removed to better expose the upper portions of the EM isolation wirebonds.

The foregoing removal of material from the upper portion of the overmold structure 59 can be achieved in a number of ways. FIG. 3O shows an example configuration 68 where such removal of material is achieved by sand-blasting. In the example, the lighter-shaded portion is where material has been removed to yield the new upper surface 65 and better exposed upper portions 66 of the RF-shielding wirebonds. The darker-shaded portion is where material has not been removed, so that the original upper surface 60 still remains. The region indicated as 69 is where the material-removal is being performed.

In the example shown in FIG. 3O, a modular structure corresponding to the underlying module substrate 20 (depicted with a dotted box 22) is readily shown. Such modules will be separated after a conductive layer is formed over the newly formed upper surface 65.

In block 12n of FIG. 2, the new exposed upper surface resulting from the removal of material can be cleaned.

In block 12o of FIG. 2, an electrically conductive layer can be formed on the new exposed upper surface of the overmold structure, so that the conductive layer is in electrical contact with the upper portions of the RF-shielding wirebonds. Such a conductive layer can be formed by a number of different techniques, including methods such as spraying or printing.

Figure 3P:
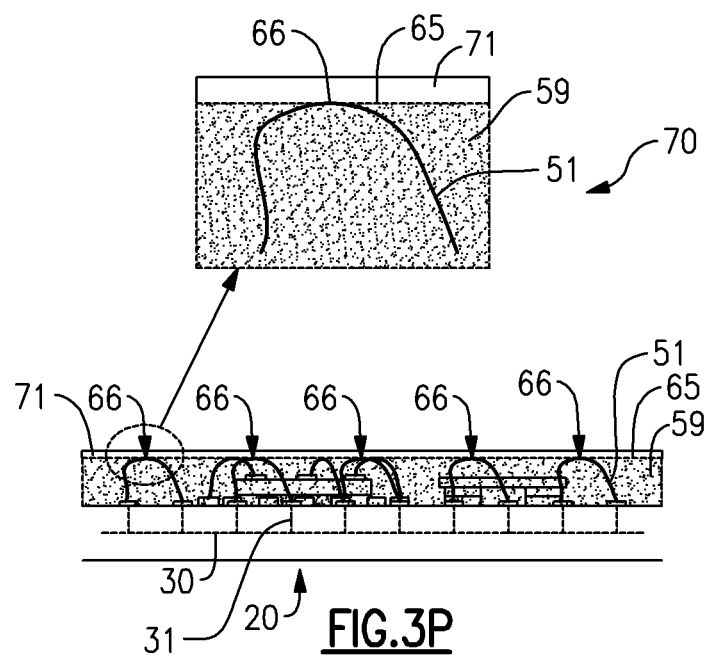
FIG. 3P shows a side view of a conductive layer formed over the overmold such that the conductive layer is in electrical contact with the exposed upper portions of the EM isolation wirebonds.

FIG. 3P shows an example configuration 70 where an electrically conductive layer 71 has been formed over the upper surface 65 of the overmold structure 59. As described herein, the upper surface 65 better exposes the upper portions 66 of the RF-shielding wirebonds 51. Accordingly, the formed conductive layer 71 forms improved contacts with the upper portions 66 of the RF-shielding wirebonds 51.

As described in reference to FIG. 3J, the RF-shielding wirebonds 51 and the ground plane 30 can yield an interconnected RF isolation structure at sides and underside of the area defined by the RF-shielding wirebonds 51. With the upper conductive layer 71 in electrical contact with the RF-shielding wirebonds 51, the upper side above the area is now shielded as well, thereby yielding a shielded volume.

Figure 3Q:
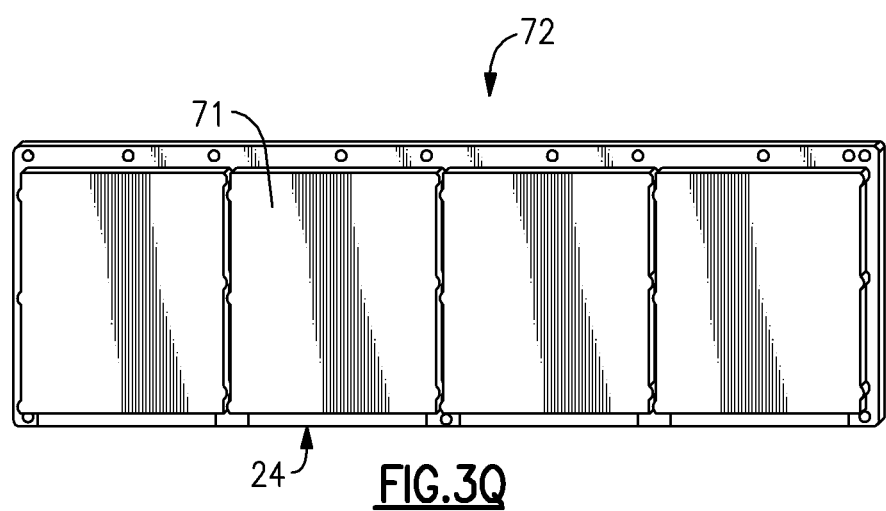
FIG. 3Q shows a photograph of a panel where the conductive layer can be a spray-on metallic paint.

FIG. 3Q shows an example panel 72 that has been sprayed with conductive paint to yield an electrically conductive layer 71 that covers multiple array sections. As described in reference to FIG. 3M, each array section includes multiple modules that will be separated.

In block 12p of FIG. 2, the modules in a array section having a common conductive layer (e.g., a conductive paint layer) can be singulated into individual packaged modules. Such singulation of modules can be achieved in a number of ways, including a sawing technique.

FIG. 3R shows an example configuration 74 where the modular section 20 described herein has been singulated into a separated module 75. The overmold portion is shown to include a side wall 77; and the module substrate portion is shown to include a side wall 76. Collectively, the side walls 77 and 76 are shown to define a side wall 78 of the separated module 75. The upper portion of the separated module 75 remains covered by the conductive layer 71. As described herein in reference to FIG. 3B, the lower surface 27 of the separated module 75 includes contact pads 28, 29 to facilitate electrical connections between the module 75 and a circuit board such as a phone board.

FIGS. 3S1, 3S2 and 3S3 show front (also referred to as top herein), back (also referred to as bottom herein) and perspective views of the singulated module 75. As described herein, such a module includes RF-shielding structures encapsulated within the overmold structure; and in some implementations, the overall dimensions of the module 75 is not necessarily any larger than a module without the RF-shielding functionality. Accordingly, modules having integrated RF-shielding functionality can advantageously yield a more compact assembled circuit board since external RF-shield structures are not needed. Further, the packaged modular form allows the modules to be handled easier during manipulation and assembly processes.

In block 12q of FIG. 2, the singulated modules can be tested for proper functionality. As discussed above, the modular form allows such testing to be performed easier. Further, the module's internal RF-shielding functionality allows such testing to be performed without external RF-shielding devices.

Figure 3T:
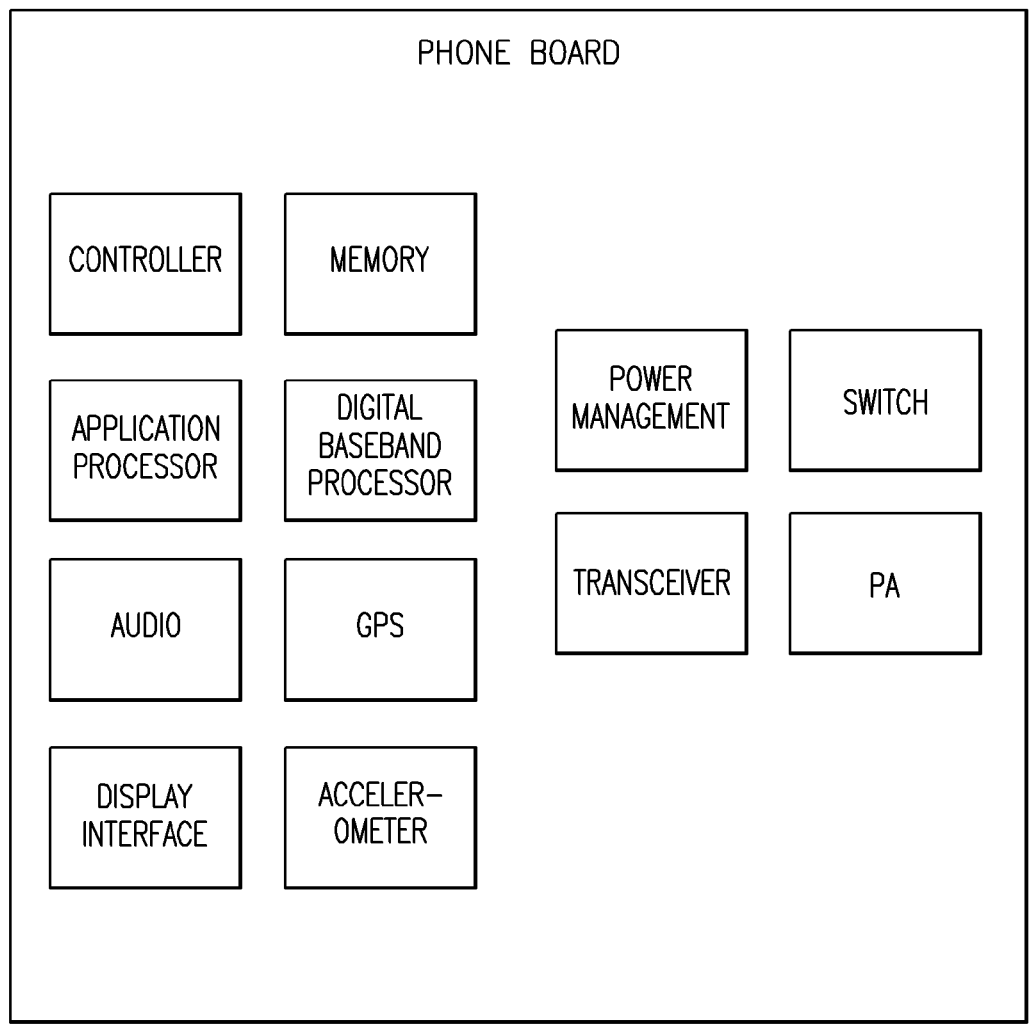
FIG. 3T shows that one or more of modules that are mounted on a wireless phone board can include one or more features as described herein.

FIG. 3T shows that in some embodiments, one or more of modules included in a circuit board such as a wireless phone board can be configured with one or more packaging features as described herein. Non-limiting examples of modules that can benefit from such packaging features include, but are not limited to, a controller module, an application processor module, an audio module, a display interface module, a memory module, a digital baseband processor module, GPS module, an accelerometer module, a power management module, a transceiver module, a switching module, and a power amplifier (PA) module.

Figure 4A:
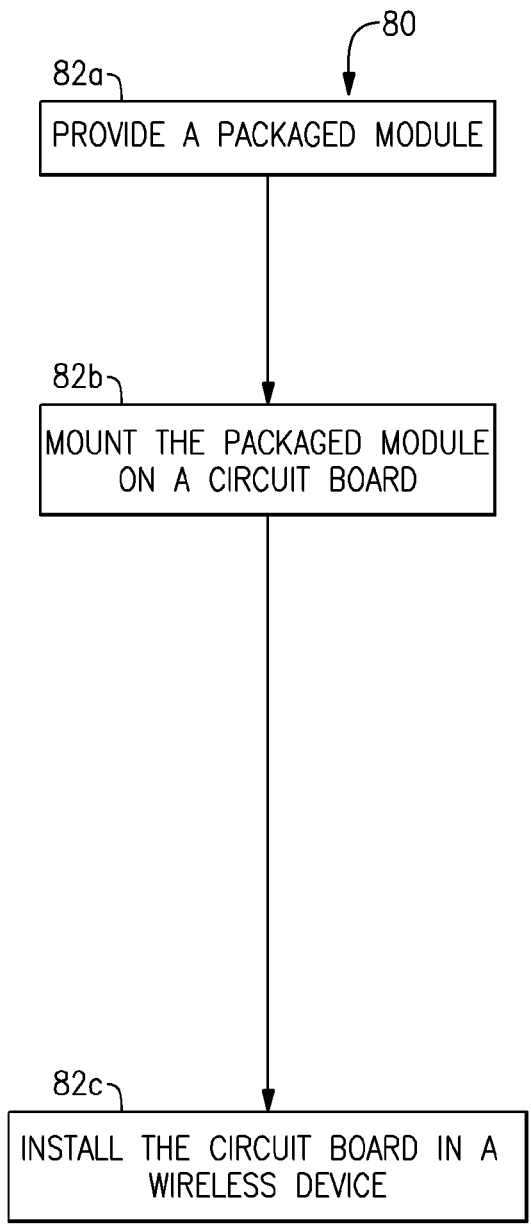
FIG. 4A shows a process that can be implemented to install a packaged module having one or more features as described herein on a circuit board such as the phone board of FIG. 3T.
Figure 4B:
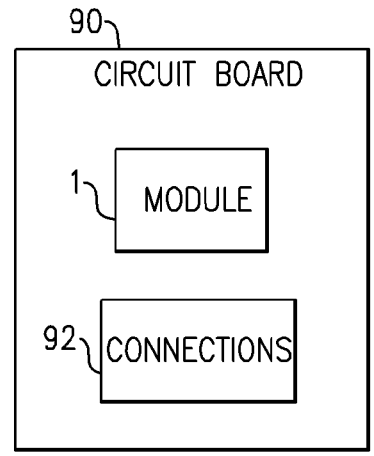
FIG. 4B schematically depicts the circuit board with the packaged module installed thereon.

FIG. 4A shows a process 80 that can be implemented to assemble a packaged module having one or more features as described herein on a circuit board. In block 82a, a packaged module can be provided. In some embodiments, the packaged module can represent a module described in reference to FIG. 3T. In block 82b, the packaged module can be mounted on a circuit board (e.g., a phone board). FIG. 4B schematically depicts a resulting circuit board 90 having module 1 mounted thereon. While one module is illustrated as being mounted on the circuit board 90, it will be understood that one or more other modules can be also be mounted thereon. The circuit board 90 can also include other features such as a plurality of connections 92 to facilitate operations of various modules mounted thereon.

Figure 4C:
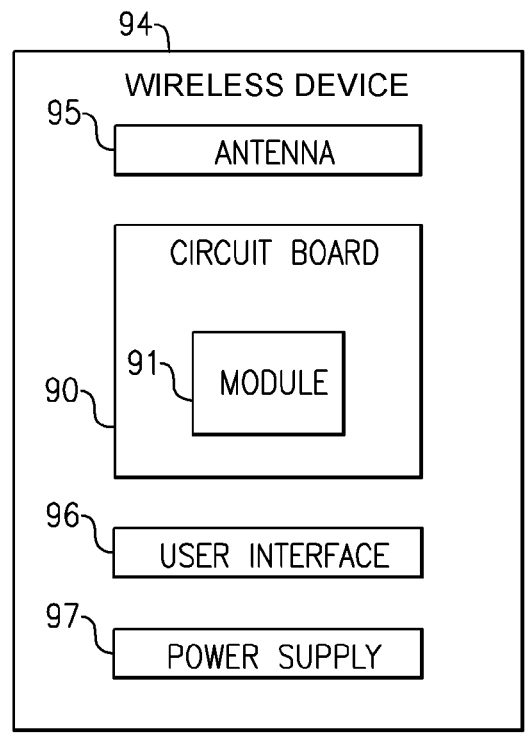
FIG. 4C schematically depicts a wireless device having the circuit board with the packaged module installed thereon.

In block 82c, a circuit board having modules mounted thereon can be installed in a wireless device. FIG. 4C schematically depicts a wireless device 94 (e.g., a cellular phone) having a circuit board 90 (e.g., a phone board). The circuit board 90 is shown to include a module 91 having one or more features as described herein. The wireless device is shown to further include other components, such as an antenna 95, a user interface 96, and a power supply 97.

Figure 4D:
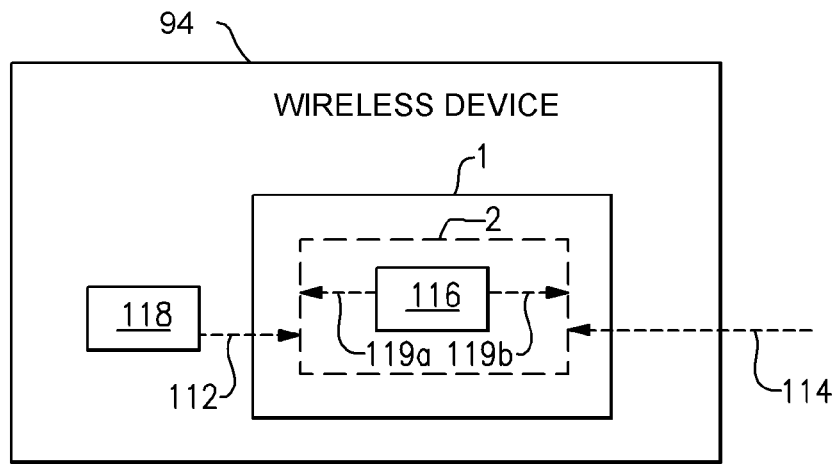
FIG. 4D schematically depicts an electronic device having a radio frequency (RF) isolation structure.

FIG. 4D schematically depicts a wireless device 94 having a packaged module 1, such as a chip or a module. The wireless device 94 illustrated in FIG. 4D can include one or more features shown in FIG. 4C, some of which have been omitted from FIG. 4D for illustrative purposes. In some embodiments, the packaged module 1 can include any of the modules described herein. As illustrated, the packaged module 1 includes an RF component 116 and an RF isolation structure 2 formed about the RF component 116 so as to provide RF isolation properties. The RF isolation structure 2 can be disposed about the perimeter of the packaged module 1 or disposed around the RF component 116 on other suitable areas of the packaged module 1. The RF isolation structure 2 can provide one or more RF isolation functionalities such as isolating the RF component 116 from an RF influence (arrow 112) from another device 118 on the electronic device 110, isolating the RF component 116 from an external RF source (arrow 114) outside of the electronic device 110, and/or preventing electromagnetic radiation (arrows 119a and 119b) from RF signals and/or noise from the RF component 116 from reaching the other device 118 on the electronic device 110 and/or to an external RF source (not shown) outside of the electronic device 110. The RF component 116 can include one or more circuit elements configured to transmit and/or receive an RF signal. Non-limiting examples of RF components include power amplifiers, voltage-controlled oscillators, filters, switches, and the like. For instance, in the embodiment illustrated in FIG. 1A, the RF component can include the high band portion 3 and/or the low band portion 4.

Although one RF component 116 is shown in FIG. 4D, it will be understood that two or more RF components can be included within an RF isolation volume resulting from the RF isolation structure 2. According to some embodiments, the packaged module 1 can include two or more RF components each having a dedicated RF isolation structure.

Figure 5A:
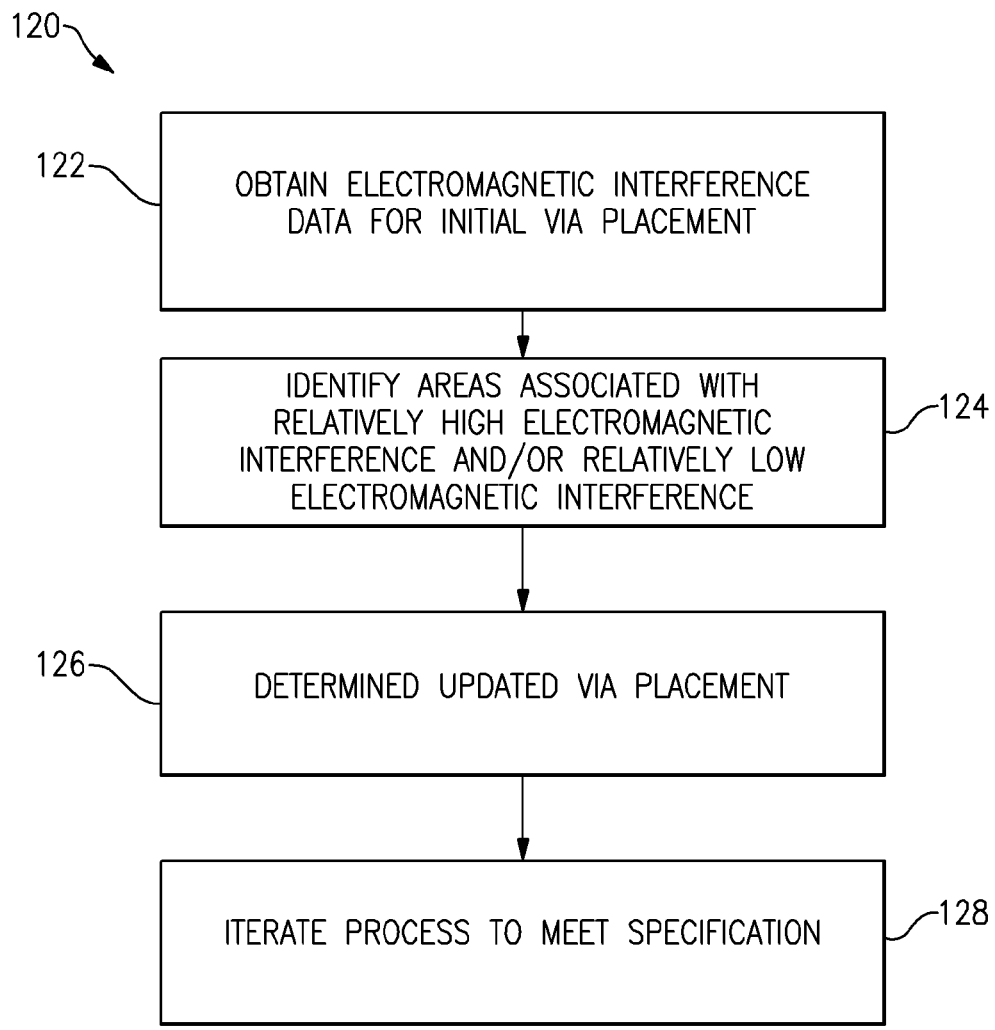
FIG. 5A is a flow diagram of an illustrative process of determining via placement according to an embodiment.

FIG. 5A is a flow diagram of an illustrative process 120 of determining via placement. Any combination of the features of the process 120 or any of the other processes described herein can be embodied in a non-transitory computer readable medium and stored in memory. When executed, the non-transitory computer readable medium can cause some or all of the process 120 or other process to be performed. It will be understood that any of the methods discussed herein may include greater or fewer operations and the operations may be performed in any order, as appropriate.

The process 120 can determine a via placement about the periphery of a packaged module. Vias can be part of an RF isolation structure that forms an RF isolation volume about one or more RF components. The vias can be formed in one layer or more layers of a substrate. In some embodiments, the vias can be formed as part of a printed circuit board, for example, as shown in FIG. 1B. Having a higher via density in a selected defined area about the perimeter of the packaged module can provide a stronger ground connection in the selected area and/or stronger RF isolation. Conversely, reducing via density in a selected area can reduce die size and overall costs of the packaged module. The process 120 can determine where vias can be removed to save die area and/or where adding vias can improve RF isolation.

The process 120 can include obtaining electromagnetic interference (EMI) data at block 122, identifying areas associated with relatively high EMI and/or relatively low EMI at block 124, and determining an updated via placement at block 126. This process can be iterated until an EMI specification is met at block 128. The process 120 will now be discussed with reference to the example EMI profiles illustrated in FIGS. 6A and 6B, the relationship between via density and inverse radiated power shown in FIG. 7, and the via placements illustrated in FIGS. 8A and 8B.

EMI data can be obtained for an initial via placement at block 122. In some embodiments, an electromagnetic scan/probe can be performed to obtain EMI data in the initial via placement. For instance, a near field scan can be performed. The EMI data can be associated with RF applications. According to certain embodiments, the EMI data can correspond to two or more modes of operation of the packaged module. For example, the EMI data can correspond to a high band mode of operation and a low band mode of operation where the packaged module operates within a lower frequency band than in the high band mode of operation. Different RF isolation considerations may apply to different frequency bands of operation. For example, at higher frequencies, RF signals can have smaller wavelengths. As a result, it can be desirable to have vias closer together near high band portions of the packaged module. As another example, the EMI data can correspond to a low power mode of operation and a high power mode of operation. The initial via placement can correspond to RF component(s) without any vias providing RF shielding according to certain implementations. Alternatively, the initial via placement can correspond to any other placement of at least one via disposed around the RF component. In certain implementations, the initial placement can correspond to a maximum number of vias that can be included in a particular size of a packaged module.

Figure 6A:
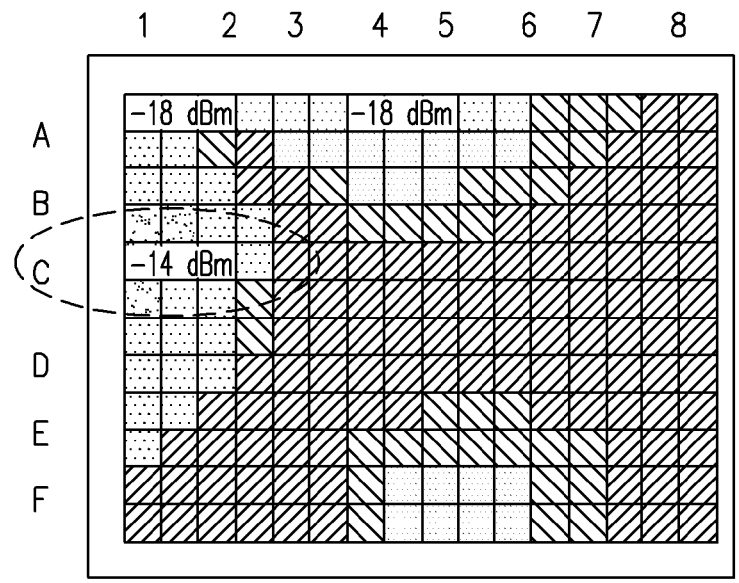
FIGS. 6A and 6B are illustrative electromagnetic interference (EMI) profiles corresponding to different via placements.
Figure 6B:
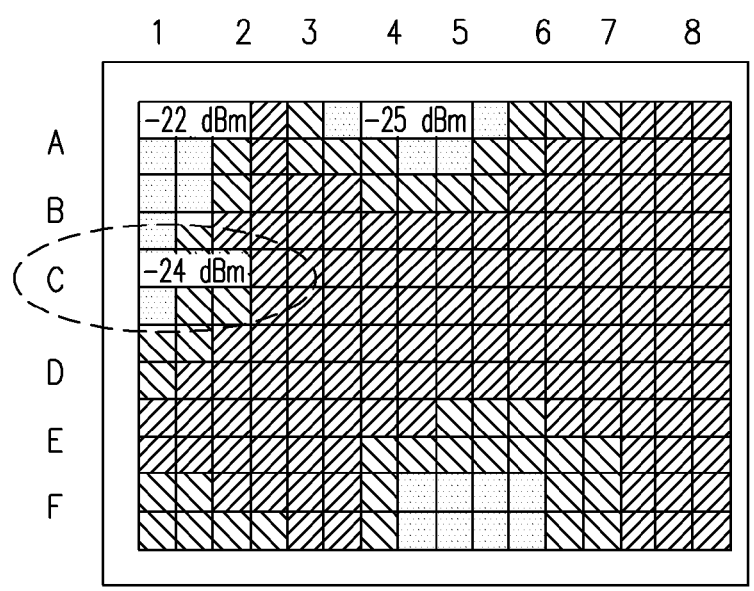

Example EMI data are reflected in the EMI profiles shown in FIGS. 6A and 6B. The EMI profiles of FIGS. 6A and 6B correspond to the via placements shown in FIGS. 8A and 8B, respectively. The EMI data reflected in FIG. 6A can correspond to an initial placement of vias or a placement of vias after one or more iterations of determining updated via placements. The EMI data reflected in FIG. 6B can correspond to an updated placement of vias determined based on EMI profile shown in FIG. 6A.

Figure 6C:
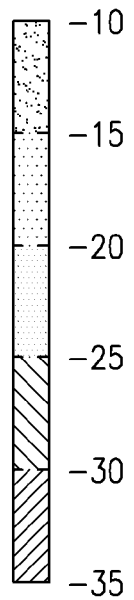
FIG. 6C is a legend for EMI data in FIGS. 6A and 6B.

FIG. 6A shows an example of an EMI profile corresponding to a plurality of vias disposed along a perimeter of a packaged module surrounding RF components. More specifically, the EMI profile shown in FIG. 6A corresponds to the placement of vias shown in FIG. 8A. The EMI profile graphically illustrates EMI associated with portions of a surface of a packaged module. In FIG. 6A, regions correspond to a square that can be identified by a column numbered from left to right along the top side of the EMI profile in FIG. 6A and a row with a letter along the left side of the EMI profile in FIG. 6A. The shading of the EMI profile indicates an EMI value associated with a corresponding area of the packaged module. More specifically, the legend of FIG. 6C indicates corresponding EMI values in dBm, which can represent a power ratio in decibels of measured EMI referenced to one milliwatt. It will be understood that a lower EMI value is represented number with a higher negative value. For instance, an EMI value of −14 dBm is higher than an EMI value of −24 dBm. The shading of the EMI profiles in FIGS. 6A and 6B corresponds to the EMI values in dBm in the legend of FIG. 6C.

Each region of the EMI profile can correspond to a defined surface area of a packaged module and/or a printed circuit board thereof. The defined surface area can include zero, one, two, or more vias. Each of the regions that include at least one via can have approximately the same width in a dimension substantially parallel to outer edge of the packaged module. Each region can have the approximately the same area in certain implementations. In other implementations, two or more regions can have different areas. It will be understood that regions can be smaller or larger than the illustrated regions. Any particular region can be associated with one or more EMI values. For instance, region B1 in FIG. 6A is associated with a plurality of EMI values and region F1 is associated with a single EMI value.

Referring back to FIG. 5A, areas associated with relatively high and/or relatively low EMI can be identified at block 124. For instance, an area of a packaged module associated with a highest EMI value can be identified. As another example, one or more areas of the packaged module associated with an EMI value above a predefined threshold can be identified. Alternatively or additionally, one or more areas of a packaged module associated with EMI value below a predefined threshold can be identified. In yet another example, an area having the lowest EMI value can be identified.

Areas of the packaged module associated with relatively high EMI can benefit by stronger RF isolation compared to other areas of the packaged module. In some implementations, an area of the packaged module associated with relatively high EMI can be a hot spot and/or an area for which the RF isolation structure provides less RF isolation than other areas of the packaged module. Such areas can provide less RF isolation than defined in product specifications and/or than desired EMI levels. According to some embodiments, hot spots can occur at or near areas of a packaged module that generate signals with a high power level, such as an output of a power amplifier (PA). In contrast, for a low noise amplifier (LNA), a hot spot can occur at or near an input of the LNA. Alternatively or additionally, hot spots can occur at or near areas of a packaged module with a high activity factor, such as near an oscillator (for example, a voltage-controlled oscillator) and/or an LNA.

Areas of the packaged module associated with relatively low EMI can provide a sufficient level of RF isolation with a relatively low via density. In some implementations, an area of the packaged module associated with relatively low EMI can be a non-radiating area and/or an area for which the RF isolation structure provides more RF isolation than other areas of the packaged module. Such areas can provide more RF isolation than defined in product specifications and/or than EMI desired levels. According to some embodiments, a non-radiating area can occur at or near areas of a packaged module that do not generate signals or that generated signals with a low power level. Alternatively or additionally, non-radiating areas can occur at or near areas of a packaged module with a low activity factor. As another example, for a power amplifier module, an RF input and DC paths can be less sensitive to EMI radiation compared to an output matching network (OMN).

The EMI profile of FIG. 6A indicates that regions B1 and C1 are associated with relatively high EMI and regions A8, B8, C8, D8, E8, and F8 are associated with relatively low EMI. In particular, an EMI value associated with region B1 is approximately −14 dBm. Such an EMI value can be problematic in certain applications. Thus, it can be desirable to adjust a via density of the packaged module to improve EMI. Via density can be adjusted by changing the number, location, size, or any combination thereof in an updated placement of vias compared to the initial placement of vias.

An RF isolation structure that includes a plurality of vias can be grounded by connection to a ground plane, for example, by an electrical connection to a lower conductive layer below an RF component that is configured as a ground plane. While the ground plane ideally has a parasitic inductance of zero, in reality, the ground plane has a non-zero parasitic inductance. Adding additional vias can reduce an inductance of the ground plane. Conversely, reducing the number of vias can increase the inductance of the ground plane. Higher inductance associated with the ground plane can lead to a less stable ground plane that can affect signals generated by an RF component being isolated by the RF isolation structure. For example, the RF isolation structure can function like an antenna when the ground plane is unstable. This can cause the RF isolation structure to amplify radiation, rather than provide RF isolation. Such an affect can occur at locations of a packaged module corresponding to relatively high EMI, for example, locations of the packaged module corresponding to regions B1 and C1 in the EMI profile shown in FIG. 6A.

Figure 7:
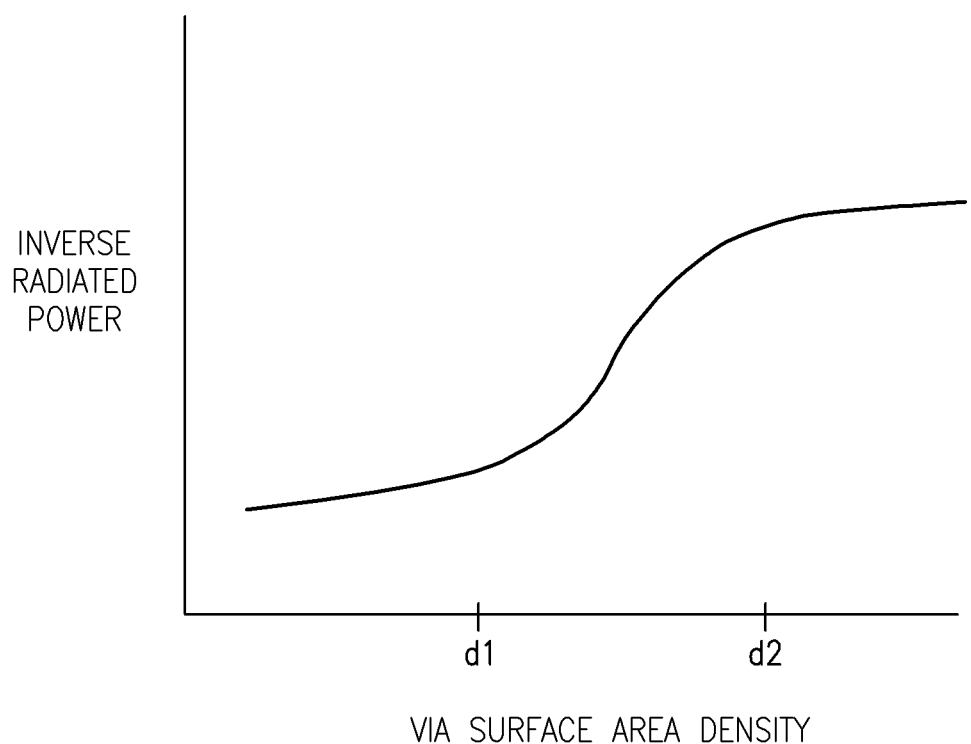
FIG. 7 illustrates a relationship among via density and inverse radiated power.

FIG. 7 illustrates a relationship among via density and inverse radiated power. When the via surface area density is below d1, the RF isolation structure can float due to a weak ground connection. A weak ground connection can cause portions of the packaged module to be associated with relatively high EMI, for example, as shown by regions B1 and C1 of the EMI profile of FIG. 6A. Density d1 can represent a lower threshold below which the RF isolation structure functions like a weak ground place. The curve illustrated in FIG. 6A has a low inverse radiated power and thus a relatively high radiation associated with via surface area densities below the density d1. This can cause the RF isolation structure to behave like an antenna. Thus, it can be desirable to increase surface area densities that are below density d1 in order to increase inverse radiated power (decrease radiated power). Density d2 can represent an upper threshold above which increased via density may not significantly improve RF isolation. Above the density d2, the curve illustrated in FIG. 7 flattens. When the via surface area density is above the density d2, advantages of increasing via density may not provide a significant increase in inverse radiated power and consequently RF isolation of the RF isolation structure. As a result, it can be desirable for the via surface area density to be between density d1 and density d2 in FIG. 7. This can, for example, reduce die area and/or reduce manufacturing costs.

Referring back to FIG. 5A, an updated via placement can be determined at block 126. In the updated via placement, via density in areas of associated with high EMI can be increased compared to the initial placement. Alternatively or additionally, in the updated via placement, via density in areas associated with low EMI can be decreased compared to the initial placement. According to certain embodiments, via density in the updated placement can be determined such that the via density is above a lower threshold below which the RF isolation structure behaves like a weak ground place and below an upper threshold above which increased via density may not significantly improve RF isolation. For instance, the via density in the updated placement can be between the density d1 and the density d2 in FIG. 7.

In the updated placement of vias, the number of vias, location of vias, size of vias, or any combination thereof can be adjusted compared to the initial placement of vias. For instance, vias can be moved away from an area associated with relatively low EMI toward an area of relatively high EMI. As another example, vias can be added to an area associated with relatively high EMI and/or vias can be removed from an area associated with relatively low EMI. In yet another example, the size of one or more vias can be increased in an area associated with relatively high EMI and/or the size of more or more vias can be decreased in an area associated with relatively low EMI.

Figure 8A:
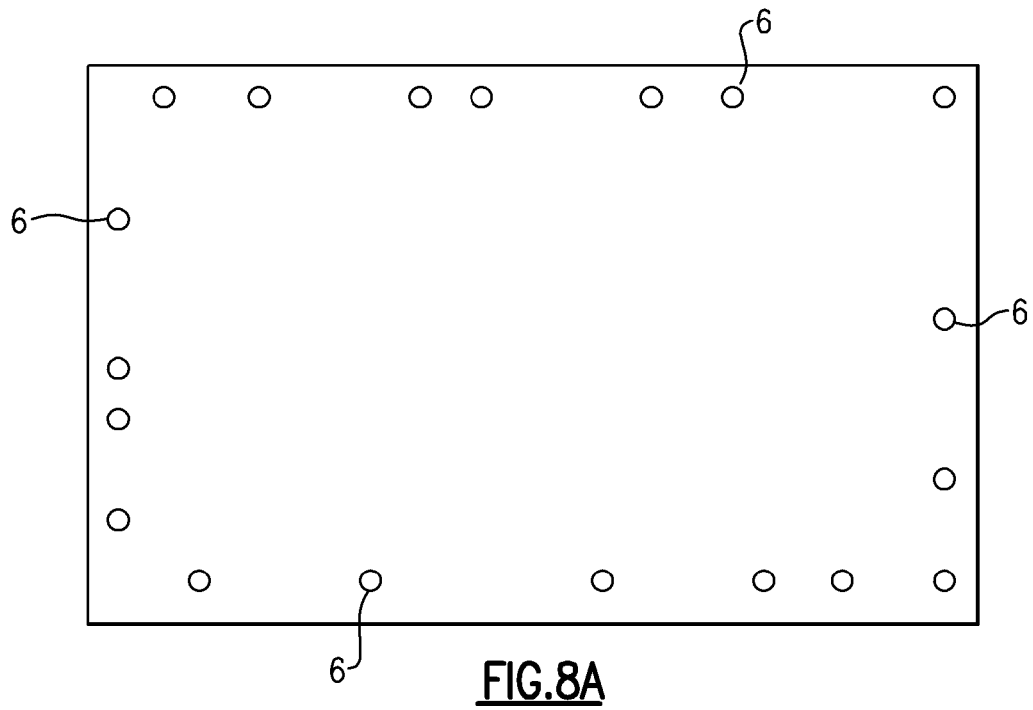
FIGS. 8A and 8B are top plan views of a substrate having via placements that correspond to the EMI profiles shown in FIGS. 6A and 6B, respectively.
Figure 8B:
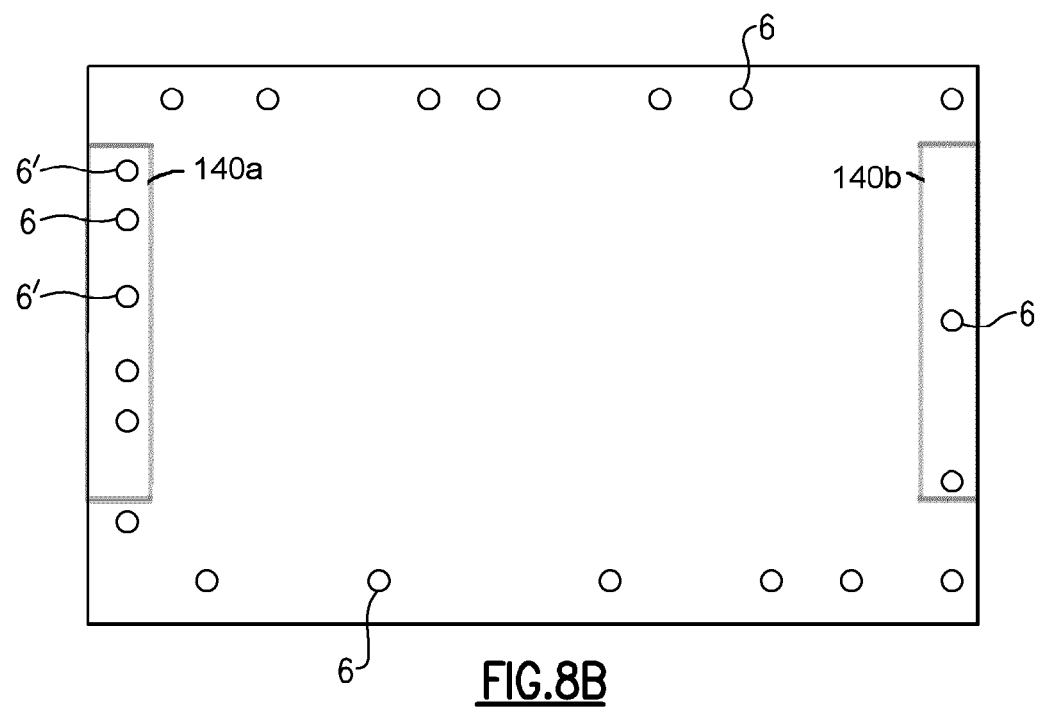

For illustrative purposes, more detail will be provided with reference to adding vias to selected locations along the periphery of a substrate. FIG. 8A shows a top plan view of a substrate having a placement of vias 6 arranged around the perimeter. As shown in FIG. 8A, the vias 6 can be aligned around the perimeter of the substrate. The vias 6 illustrated in FIG. 8A can be included in the same layer of the substrate. The placement of vias 6 shown in FIG. 8A can correspond to the EMI profile shown in FIG. 6A. FIG. 8B shows another top plan view of the substrate having an updated placement of vias 6 and 6' arranged around the perimeter. The placement of vias 6 and 6' shown in FIG. 8B can correspond to the EMI profile shown in FIG. 6B. According to some embodiments, the placement of vias 6 and 6' in FIG. 8B can be a final placement of vias used in a manufactured packaged module.

In the updated placement shown in FIG. 8B, two additional vias 6' were added in areas of the substrate corresponding to regions B1 and C1 compared to the placement of vias 6 shown in FIG. 8A. The EMI profile of FIG. 6B shows that the two additional vias 6' improved the EMI associated with a corresponding region in the EMI profile. For instance, the EMI profile of FIG. 6B indicates that EMI for region C1 improved by about 10 dBm compared to the EMI profile of FIG. 6A without the two additional vias 6'. The EMI profile of FIG. 6B shows that the two additional vias 6' improved the EMI associated in other neighboring regions in the EMI profile. For instance, the EMI profile of FIG. 6B indicates that EMI for region A1 improved by about 4 dBm and the EMI for region A4 improved by about 7 dBm compared to the EMI profile of FIG. 6A without the two additional vias 6'.

Referring back to FIG. 5A, the process can be iterated any suitable number of times until an EMI specification is met at block 128. More specifically, EMI data can be obtained, areas associated with relatively high and/or relatively low EMI can be identified, and an updated placement of vias can be determined. Thus, the process 120 can be an iterative process in certain implementations. For instance, the EMI profile of FIG. 6A and the via placement shown in FIG. 8A can correspond to an iteration of the process 120 that is between an initial via placement and a final via placement that is used in production. According to certain embodiments, at block 128, the process 120 can be iterated for different modes of operation such that EMI specifications are met for the different modes of operation. The different modes of operation can be, for example, associated with different frequency bands and/or different power modes. In some embodiments, the process 120 can be iterated at block 128 for different layers of vias 6.

By executing the process 120, via placement can be improved such that EMI associated with a packaged module meets a specification without using excess vias. Accordingly, the process 120 can result in packaged modules with vias configured to provide RF isolation with efficient utilization of die area.

Figure 5B:
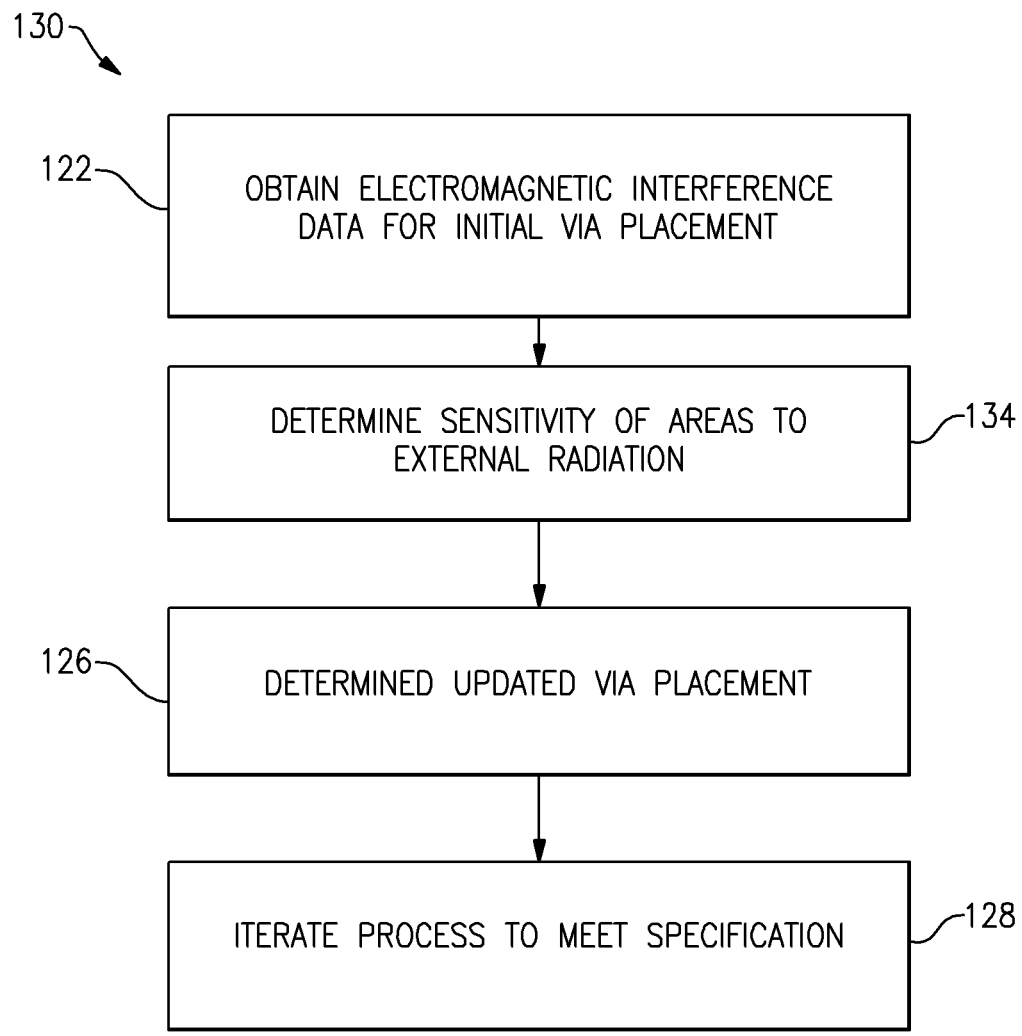
FIG. 5B is a flow diagram of an illustrative process of determining via placement according to another embodiment.

FIG. 5B is a flow diagram of an illustrative process 130 of determining via placement. The process 130 can be substantially the same as the process 120, except that block 124 of the process 120 is replaced with block 134 in the process 130. Thus the process 130 can include any combination of features described earlier with reference to obtaining EMI data at block 122, determining an updated via placement at block 126, and iterating the process at block 128. The process 130 can include obtaining EMI data at block 122, determining sensitivity of areas to external radiation at block 134, and determining an updated via placement at block 126. The process 130 can be iterated until an EMI specification is met at block 128. It will be understood that, according to certain embodiments, the process 120 and the process 130 can be performed together, in serial, in parallel, or any combination thereof. Thus, via placements can be based on a relative level of EMI associated with area(s) of a packaged module and/or a sensitivity of the area(s) of the packaged module to external radiation.

The principles and advantages described in connection with areas of a packaged module associated with relatively low and/or relatively high EMI can be applied to areas of the packaged module that area relatively sensitive and/or relatively insensitive to external radiation at block 134. For instance, sensitivity data can be obtained and areas that are relatively more sensitive to electromagnetic radiation and/or areas that are relatively less sensitive to electromagnetic radiation can be identified. In some embodiments, the sensitivity data can include EMI data, such as the EMI profile shown in FIG. 6A, and/or data derived from such EMI data. Areas of the packaged module that are sensitive to external radiation can be treated similarly to areas of the packaged module associated with relatively high EMI. For instance, at block 134, the via density in these areas can be increased at block 134. Alternatively or additionally, areas of the packaged module that are not sensitive to external radiation can be treated similarly to areas of the packaged module associated with relatively low EMI. Areas that are sensitive to external radiation can include, for example, an output matching network (OMN) area of a power amplifier module and/or an output of a VCO. By contrast, areas that are not sensitive to external radiation can include, for example, input areas and/or DC paths.

Packaged modules in accordance with one or more features described herein can include particular via placements. For instance, the plurality of vias can be disposed around an RF component such that there is a higher density in a first region of the packaged module than in a second region of the packaged module, in which the first region is associated with a higher electromagnetic interference than the second region. For instance, the vias 6 and 6' in FIG. 8B are included in region 140a that corresponds to regions B1 and C1 of the illustrated EMI profiles. Region 140a has a higher density than region 140a that corresponds to regions B8 and C8 of the illustrated EMI profiles. Regions 140a and 140b are provided for illustrative purposes, and it will be understood that other regions and/or region sizes can be implemented in connection with one or more features described herein.

Different via densities can be achieved a variety of ways. For example, as illustrated in FIG. 8B, the region 140a includes more vias than the region 140b. When vias of the plurality of vias are about the same size, vias that are spaced more closely together in the same layer of the substrate have a higher via density. For instance, the vias 6 and 6' are spaced more closely together in the region 140a than the vias 6 in the region 140b. As another example, different via densities can be achieved by using differently sized vias.

As illustrated in FIG. 8B, the region 140a is disposed along a periphery of the packaged module and the region 140b is also disposed along the periphery of the packaged module. The regions 140a and 140b have a width that is approximately the same in a dimension substantially parallel to outer edges of the packaged module. As illustrated in FIG. 8B, the region

140*a* has approximately the same area as the region 140*b*. In certain embodiments, the first region can have a via density that is at least as great as any region along the periphery of the packaged module with an area that is at least as big as the area of the first region. Alternatively or additionally, the second region can have a via density that is no greater than the density of any region along the periphery of the packaged module with an area that is at least as big as the area of the second region.

The vias 6 and 6' disposed along the periphery of the packaged module can be spaced closer together along the periphery of the packaged module in a hot spot than in a low radiating area. Such via spacing can be in one or more layers of the substrate. For instance, in a single layer of the substrate, the vias 6 and 6' disposed along the periphery of the packaged module can be spaced closer together along the periphery of the packaged module in a hot spot than in a low radiating area. As another example, vias can be spaced closer together along the periphery of the packaged module in a hot spot than in a low radiating area in each of two or more layers of the substrate. Referring to FIG. 8B, the illustrated vias 6 and 6' are spaced closer together in the region 140*a* than in the region 140*b*. The vias 6 and 6' can be aligned along the periphery of the packaged module, for example, as shown in FIGS. 8A and 8B.

In the packaged module, the first region and the second region having a lower via density than the first region can each include at least one via. The first region and the second region having a lower via density than the first region can each include at least two vias.

One or more RF components being isolated by the RF isolation structure can emit more radiation to the first region than to the second region. For instance, the RF component(s) can emit more radiation to region 140*a* than to region 140*b*.

The first region can correspond to a hot spot of the packaged module and the second region can correspond to a low radiating area of the packaged module. For example, the region 140*a* can be adjacent to a power amplifier output or an output of a different RF component that generates a high power signal. As another example, the region 140*a* can be adjacent to a voltage-controlled oscillator output or an output of a different RF component that has a high activity factor. By contrast, the second region can be adjacent to an area of the packaged module with a low activity factor, an area of the packaged module that does not generate signals, an area of the packaged module in which low power signal propagate, the like, or any combination thereof.

Alternatively or additionally, the first region can be exposed to more external radiation than the second region. For instance, a hot spot of an adjacent component could be adjacent to the region 140*a*.

The via placements described herein can be included in an RF isolation structure of a packaged module that includes one or more conductive features forming at least a portion of an electrical connection between the plurality of vias and a conductive layer above the RF component. As one example, the one or more conductive features can include wirebonds, for example, the wirebonds 51 illustrated in FIG. 1B. Alternatively, the one or more conductive features can include a metal can surrounding the RF component.

In certain embodiments, the RF component within the RF isolation volume formed by the RF isolation structure includes a power amplifier. For example, the via placement illustrated in FIG. 8B can correspond to the packaged module illustrated in FIGS. 1A and 1B. The region 140*a* can be adjacent to a power amplifier output. More specifically, the region 140*a* can be adjacent to an output of a power amplifier in the high band portion 3 of the packaged module 1 of FIG. 1A.

Some of the embodiments described above have provided examples in connection with packaged modules and/or electronic devices that include RF components, such as power amplifiers. However, the principles and advantages of the embodiments can be used for any other systems or apparatus that have needs for a shielding and/or isolation.

Systems implementing one or more aspects of this disclosure can be implemented in various electronic devices. Examples of electronic devices can include, but are not limited to, consumer electronic products, parts of the consumer electronic products, electronic test equipment, etc. More specifically, electronic devices configured implement one or more aspects of the present disclosure can include, but are not limited to, an RF transmitting device, an RF receiving device, an RF transceiver, any portable device having an RF component (for example, a power amplifier), a mobile phone (for example, a smart phone), a telephone, a base station, a femtocell, a radar, a device configured to communicate according to the WiFi and/or Bluetooth standards, a television, a computer monitor, a computer, a hand-held computer, a tablet computer, a laptop computer, a personal digital assistant (PDA), a microwave, a refrigerator, an automobile, a stereo system, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, the like, etc. Part of the consumer electronic products can include a multi-chip module including an RF isolation structure, a power amplifier module, an integrated circuit including an RF isolation structure, a substrate including vias that can be used to form part of an RF isolation structure, the like, or any combination thereof. Moreover, other examples of the electronic devices can also include, but are not limited to, memory chips, memory modules, circuits of optical networks or other communication networks, and disk driver circuits. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or connected, as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those ordinary skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A wireless device comprising:
an antenna configured to facilitate at least one of transmitting or receiving a radio-frequency (RF) signal;
a packaged module in communication with the antenna, the packaged module including a ground contact configured to receive a ground potential; a plurality of vias in a substrate, the plurality of vias disposed along a periphery of the packaged module, and vias of the plurality of vias being spaced closer together along the periphery of the packaged module in a hot spot than in a low radiating area; a conductive trace disposed along the periphery of the substrate and in a different layer of the substrate than the plurality of vias; an RF circuit coupled to a major surface of the substrate; and a conductive layer disposed over the RF circuit, the conductive layer electrically coupled to the plurality of vias and the ground contact such that the plurality of vias and the conductive layer form at least a portion of an RF isolation structure around the RF circuit, and the conductive trace being included in an electrical connection between the conductive layer and the ground contact; and
an other module in communication with the packaged module.

2. The wireless device of claim 1 wherein the hot spot is associated with electromagnetic interference generated by the packaged module and the plurality of vias are configured to isolate the other module from the electromagnetic interference associated with the hot spot.

3. The wireless device of claim 1 wherein the hot spot is associated with electromagnetic interference generated by the other module and the plurality of vias are configured to shield the packaged module from electromagnetic interference associated with the hot spot.

4. The wireless device of claim 1 wherein the packaged module further includes conductive features above the substrate and forming at least a portion of an electrical connection between the plurality of vias and the conductive layer, the RF isolation structure including the conductive features.

5. The wireless device of claim 4 wherein the conductive features include wirebonds.

6. The wireless device of claim 1 wherein at least one of the plurality of vias is electrically connected between the RF circuit and the conductive trace.

7. The wireless device of claim 1 wherein the hot spot has the highest density of vias of any region along the periphery of the packaged module that has an area at least as large as the hot spot.

8. The wireless device of claim 1 wherein the RF circuit includes a power amplifier.

9. The wireless device of claim 1 wherein the RF circuit includes at least one of a voltage-controlled oscillator, a filter, or an RF switch.

10. The wireless device of claim 1 wherein the vias of the plurality of vias are spaced closer together in the same layer of the substrate along the periphery of the packaged module in the hot spot than in the low radiating area.

11. The wireless device of claim 1 wherein the substrate is a laminate substrate.

12. The wireless device of claim 1 wherein the RF isolation structure includes a ground plane electrically coupled to the ground contact.

13. The wireless device of claim 1 wherein the packaged module and the other module are on a common circuit board.

14. The wireless device of claim 1 configured as a mobile phone.

15. A packaged module comprising:
a ground contact configured to receive a ground potential;
a plurality of vias in a substrate, the plurality of vias disposed along a periphery of the packaged module, and vias of the plurality of vias being spaced closer together along the periphery of the packaged module in a hot spot than in a low radiating area;
a conductive trace along the periphery of the substrate and in a different layer of the substrate than the plurality of vias;
an RF circuit coupled to a major surface of the substrate; and
a conductive layer disposed over the RF circuit, the conductive layer electrically coupled to the plurality of vias and the ground contact such that the plurality of vias and the conductive layer form at least a portion of an RF isolation structure around the RF circuit, the conductive trace being included in an electrical connection between the conductive layer and the ground contact.

16. The packaged module of claim 15 further comprising conductive features above the substrate, the conductive features forming at least a portion of an electrical connection between the plurality of vias and the conductive layer, and the RF isolation structure including the conductive features.

17. The packaged module of claim 15 wherein the hot spot has the highest density of vias of any region along the periphery of the packaged module that has an area at least as large as the hot spot.

18. The packaged module of claim 15 wherein the vias of the plurality of vias are spaced closer together in the same layer of the substrate along the periphery of the packaged module in the hot spot than in the low radiating area.

19. The packaged module of claim 15 wherein the RF circuit includes at least one of a power amplifier, a voltage-controlled oscillator, a filter, or an RF switch.

* * * * *